US012389356B2

(12) United States Patent
Ballantyne et al.

(10) Patent No.: US 12,389,356 B2
(45) Date of Patent: Aug. 12, 2025

(54) OPPORTUNISTIC CALIBRATION OF A CLOCK

(71) Applicant: Intel Corporation, Santa Clara, CA (US)

(72) Inventors: Wayne Ballantyne, Chandler, AZ (US); Benjamin Jann, Portland, OR (US); Bruce Geren, Chandler, AZ (US); Gregory Chance, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 730 days.

(21) Appl. No.: 17/549,042

(22) Filed: Dec. 13, 2021

(65) Prior Publication Data

US 2023/0189182 A1  Jun. 15, 2023

(51) Int. Cl.
*H04W 56/00* (2009.01)
*H03K 3/03* (2006.01)

(52) U.S. Cl.
CPC ........ *H04W 56/005* (2013.01); *H03K 3/0315* (2013.01)

(58) Field of Classification Search
CPC .................................................. H04W 56/005
USPC .......................................................... 331/44
See application file for complete search history.

(56) References Cited

U.S. PATENT DOCUMENTS

2017/0040985 A1* 2/2017 Chen ................ H03K 19/00369
2019/0268010 A1* 8/2019 Wu ......................... H03L 7/187

* cited by examiner

*Primary Examiner* — Joseph Chang
(74) *Attorney, Agent, or Firm* — Schwegman Lundberg & Woessner, P.A.

(57) ABSTRACT

A wireless communication device can include an oscillator circuit. The oscillator circuit can include an oscillator and measurement circuitry coupled to the oscillator. The measurement circuitry can receive an output signal of the oscillator and measure oscillator error by comparing the output signal of the oscillator to a nominal frequency for an amount of time. The oscillator circuit can further include adjustment circuitry to adjust an oscillator frequency of the oscillator based on the measured oscillator error.

22 Claims, 17 Drawing Sheets

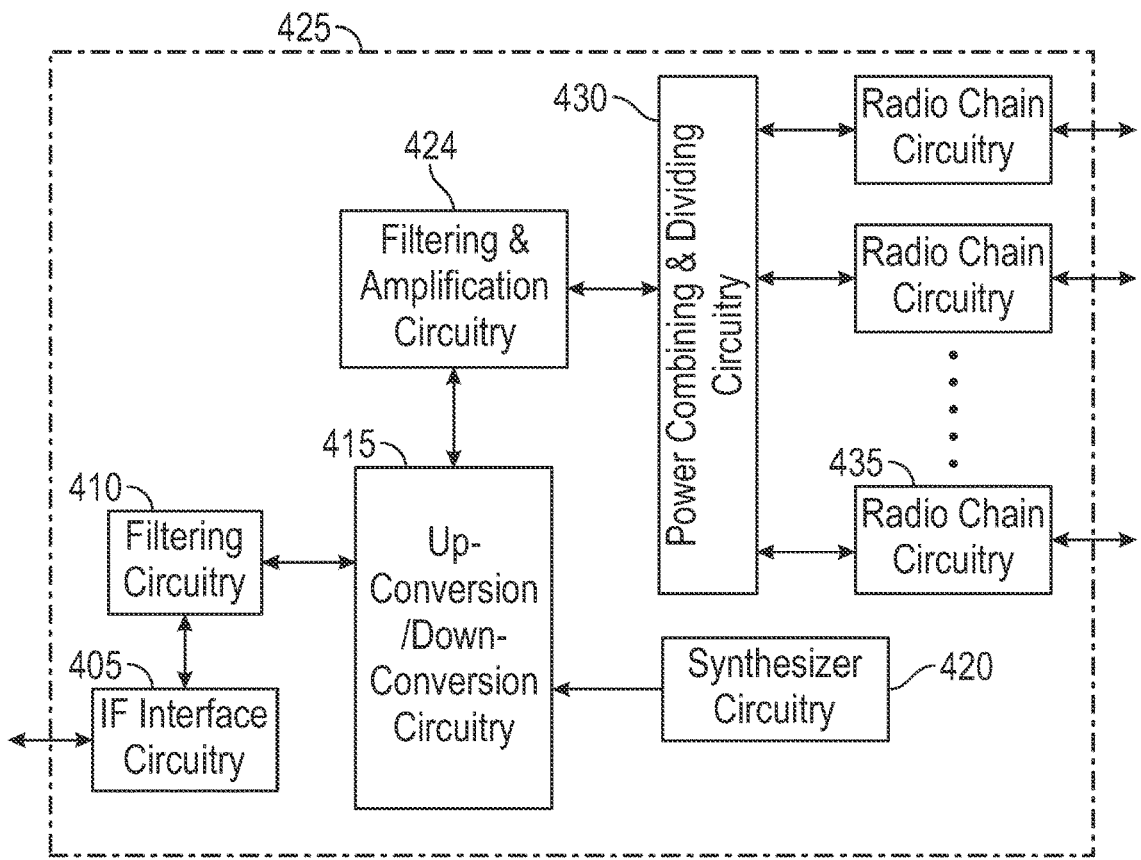
FIG. 4
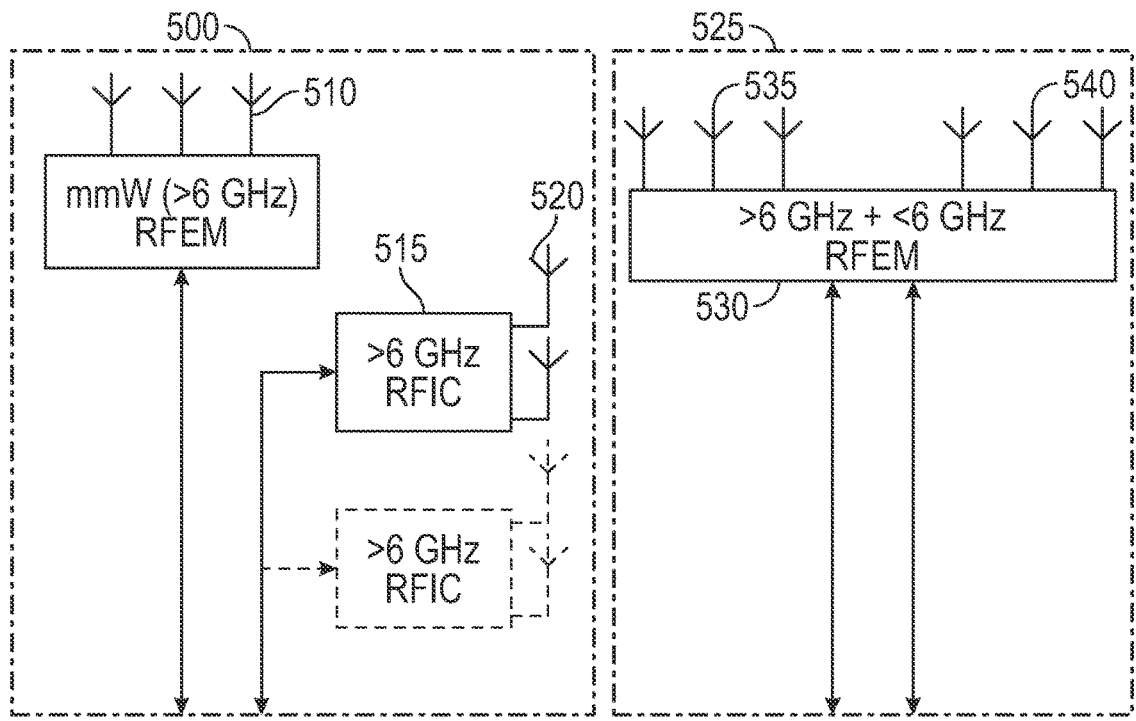
FIG. 5A
FIG. 5B

OPPORTUNISTIC CALIBRATION OF A CLOCK

TECHNICAL FIELD

Aspects of the disclosure pertain to radio frequency (RF) communications. More particularly, aspects relate to oscillators used in RF communications.

BACKGROUND

Some RF front-end (RFFE) chips, such as beamformer chips, power amplifiers, temperature sensors, and power detectors, do not require a precise oscillator and therefore providing such an expensive oscillator may not be justified for those RFFE chips. On the other hand, an on-die clock is used to complete certain operations in these chips, whose accuracy may vary significantly over process and temperature. Therefore, there is a general need to improve accuracy of less expensive oscillators while avoiding use of highly expensive precision oscillators.

BRIEF DESCRIPTION OF THE DRAWINGS

In the drawings, which are not necessarily drawn to scale, like numerals may describe similar components in different views. Like numerals having different letter suffixes may represent different instances of similar components. Some aspects are illustrated by way of example, and not limitation, in the figures of the accompanying drawings in which:

FIG. 4 illustrates exemplary useable RF circuitry in FIG. 3A according to some aspects.

FIG. 5A illustrates an aspect of an exemplary radio front end module (RFEM) according to some aspects.

FIG. 5B illustrates an alternate aspect of an exemplary radio front end module, according to some aspects.

DETAILED DESCRIPTION

Figure 1:
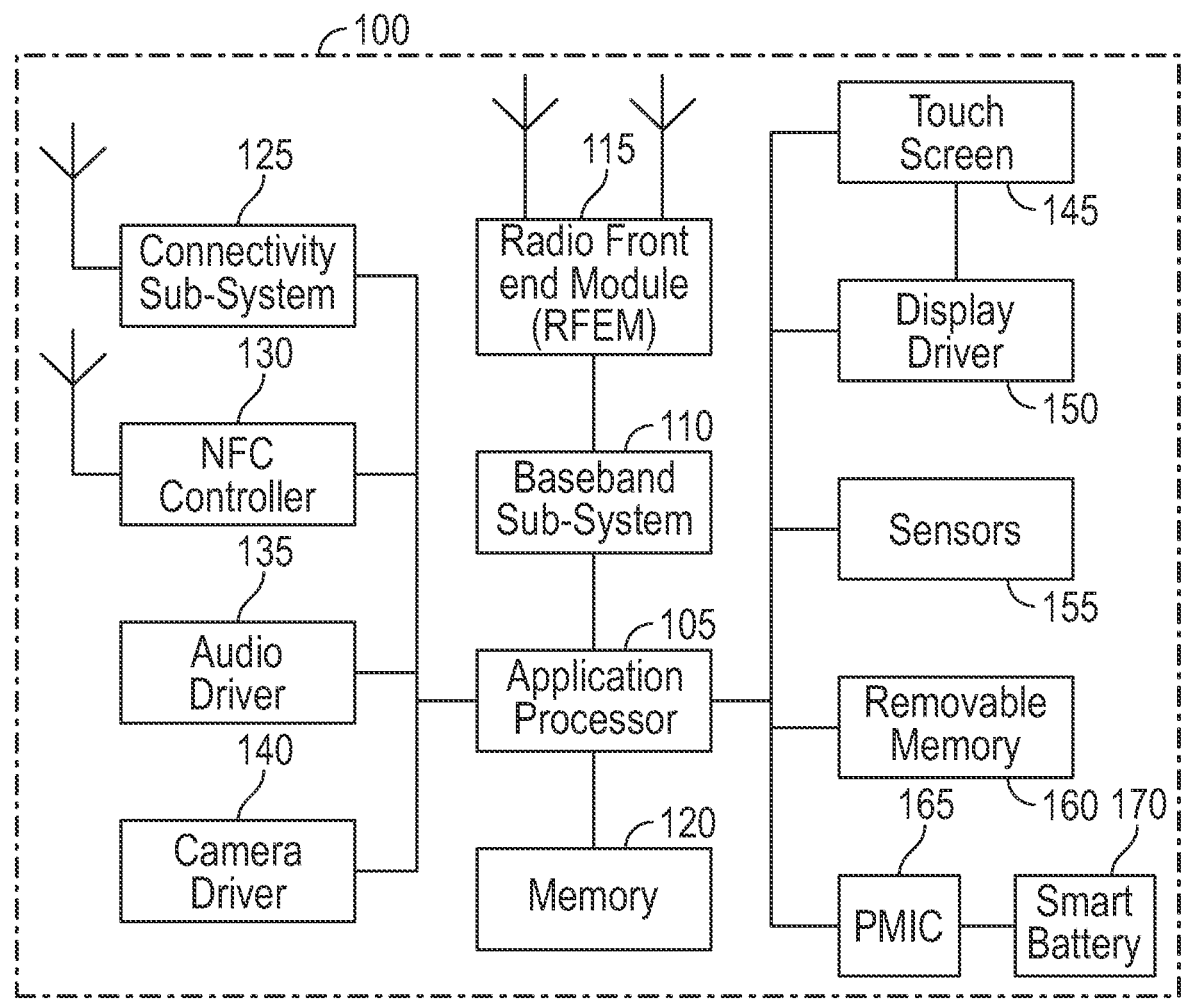
FIG. 1 illustrates an exemplary user device according to some aspects.

The following description and the drawings sufficiently illustrate specific aspects to enable those skilled in the art to practice them. Other aspects may incorporate structural, logical, electrical, process, and other changes. Portions and features of some aspects may be included in, or substituted for, those of other aspects. Aspects set forth in the claims encompass all available equivalents of those claims.

In mmWave beamformer chips, and other RF front-end (RFFE) chips such as power amplifiers, a precise oscillator or phase-locked loop (PLL) circuit is inappropriate and cannot be justified. Yet, these low-complexity RFFE chips do use on-die clocks to complete certain operations such as running power-up state machines, reading out electronic fuse (EFUSE) data, taking analog-to-digital (ADC) readings of a temperature sensor or power detector, running local timers, and other operations. While less precision is needed from clocks on these RFFE chips, some degree of precision should be present, and improved precision provides several system level benefits.

Some available systems address these concerns by employing a system serial peripheral interface (SPI) clock or similar protocol or communication clock. In these systems, dummy SPI commands are planned to add extra clocks, at the frequency of the SPI clock (typically about 25-50 MHz range) after a SPI command (e.g., a chip select function) is executed, so that the chip can perform other necessary operations (e.g., an ADC conversion) accurately after completion of the command (e.g., SPI command). For some operations, including initial EFUSE readout, thousands of such dummy SPI clocks may be used, consuming system control bandwidth. Such a system may also be in use in various specifications, for example, in the Mobile Industry Processor Interface (MIPI) RFFE v3.0 specification, in which a Timed Triggers feature was introduced, and makes use of "dummy clocks" similarly to that described above. Such dummy clocks can allow a MIPI RFFE device counter to trigger the desired event execution at a pre-loaded trigger time.

However, most RC oscillators and ring oscillators in use today may not be accurate enough for some operations. Most RC oscillators and ring oscillators are accurate within a +/−10 to +/−20% range for process variation alone, with temperature adding further variation of 10% or more. Therefore, oscillator frequencies can swing unpredictably based on temperature and require periodic re-adjustment using characterization or simulation data sets, which increases downtime of the system. Even if the ring oscillator or RC oscillator can be dynamically adjusted in operation, the adjustment process remains slow and requires temperature readings and use of lookup tables to determine a nominal oscillator adjustment based on characterization.

Furthermore, the use of dummy commands (e.g., SPI or MIPI RFFE), in addition to consuming control interface bandwidth, may still be inaccurate due to the possibility of gaps between commands and, if the required on-die clock frequency is higher than the SPI or MIPI RFFE clock frequency, then the dummy command approach cannot be used.

Another approach is to use additional control lines to schedule separate events, e.g., transmit and receive activation/disablement. In this way a clock is not used, and a control command is received instead to perform some functions. However, this approach adds additional control lines, which take up space in an already-densely-packed mmWave beamformer array.

To address these and other concerns, in aspects, the disclosure provides for including an adjustable oscillator on an integrated circuitry (IC) (e.g., a mmWave beamformer), and controlling the IC using a control protocol having a precise clock frequency such as SPI or MIPI RFFE, although aspects of the disclosure are not limited to usage with SPI or MIPI RFFE. During presence or execution of standard control protocol message, the adjustable oscillator is enabled and automatically calibrated based on the number of clocks sent in the control message. Depending on the command sent, the adjustable oscillator will remain enabled (after the control message finishes), for a fixed number of clocks, sufficient for the functionality required (e.g., ADC conversion). After performing the functionality required (e.g., ADC conversion), the adjustable oscillator will shut down without further control protocol commands.

The communication systems, devices, and other components in which an adjustable oscillator in accordance with some aspects are implemented, are described in more detail with respect to FIG. 1-9.

An integrated Radio-Frequency frontend module (FEM) is broadly used in the frontend circuits for cellular handsets or other wireless devices. FIG. 1 illustrates an exemplary user device according to some aspects. The user device 100 may be a mobile device in some aspects and includes an application processor 105, baseband processor 110 (also referred to as a baseband sub-system), radio front end module (RFEM) 115, memory 120, connectivity sub-system 125, near field communication (NFC) controller 130, audio driver 135, camera driver 140, touch screen 145, display driver 150, sensors 155, removable memory 160, power management integrated circuit (PMIC) 165, and smart battery 170.

In some aspects, application processor 105 may include, for example, one or more central processing unit (CPU) cores and one or more of cache memory, low drop-out voltage regulators (LDOs), interrupt controllers, serial interfaces such as SPI, I2C or universal programmable serial interface sub-system, real time clock (RTC), timer-counters including interval and watchdog timers, general purpose IO, memory card controllers such as SD/MMC or similar, USB interfaces, MIPI interfaces, and/or Joint Test Access Group (JTAG) test access ports.

In some aspects, baseband processor 110 may be implemented, for example, as a solder-down substrate including one or more integrated circuits, a single packaged integrated circuit soldered to a main circuit board, and/or a multi-chip module including two or more integrated circuits.

Applications of mmWave technology can include, for example, WiGig and future 5G, but the mmWave technology can be applicable to a variety of telecommunications systems. The mmWave technology can be especially attractive for short-range telecommunications systems. WiGig devices operate in the unlicensed 60 GHz band, whereas 5G mmWave operates in the licensed 28 GHz and 39 GHz bands. A block diagram of an example baseband processor 110 and RFEM 115 in a mmWave system is shown in FIG. 1A.

Figure 1A:
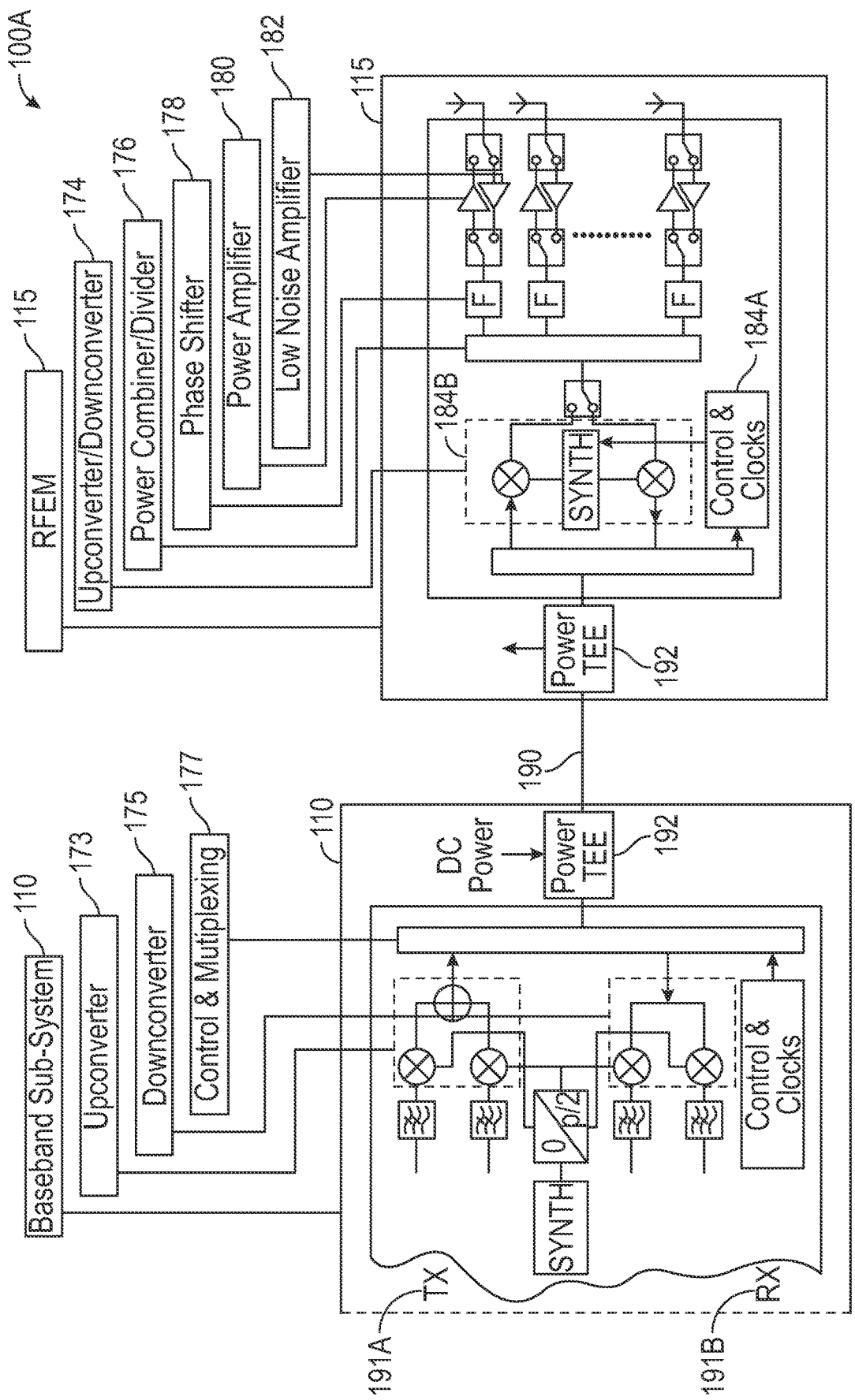
FIG. 1A illustrates a mmWave system, which can be used in connection with the device of FIG. 1 according to some aspects.

FIG. 1A illustrates a mmWave system 100A, which can be used in connection with the device 100 of FIG. 1 according to some aspects of the present disclosure. The system 100A includes two components: a baseband processor 110 and one or more radio front end modules (RFEMs) 115. The RFEM 115 can be connected to the baseband processor 110 by a single coaxial cable 190, which supplies a modulated intermediate frequency (IF) signal, DC power, clocking signals and control signals.

The baseband processor 110 is not shown in its entirety, but FIG. 1A rather shows an implementation of analog front end. This includes a transmitter (TX) section 191A with an upconverter 173 to intermediate frequency (IF) (around 10 GHz in current implementations), a receiver (RX) section 191B with downconversion 175 from IF to baseband, control and multiplexing circuitry 177 including a combiner to multiplex/demultiplex transmit and receive signals onto a single cable 190. In addition, power tee circuitry 192 (which includes discrete components) is included on the baseband circuit board to provide DC power for the RFEM 15. In some aspects, the combination of the TX section and RX section may be referred to as a transceiver, to which may be coupled one or more antennas or antenna arrays of the types described herein.

The RFEM 115 can be a small circuit board including a number of printed antennas and one or more RF devices containing multiple radio chains, including upconversion/downconversion 174 to millimeter wave frequencies, power combiner/divider 176, programmable phase shifting 178 and power amplifiers (PA) 180, low noise amplifiers (LNA) 182, as well as control and power management circuitry 184A and 184B. This arrangement can be different from Wi-Fi or cellular implementations, which generally have all RF and baseband functionality integrated into a single unit and only antennas connected remotely via coaxial cables.

This architectural difference can be driven by the very large power losses in coaxial cables at millimeter wave frequencies. These power losses can reduce the transmit power at the antenna and reduce receive sensitivity. In order to avoid this issue, in some aspects, PAs 180 and LNAs 182 may be moved to the RFEM 115 with integrated antennas. In addition, the RFEM 115 may include upconversion/downconversion 174 so that the IF signals over the coaxial cable 190 can be at a lower frequency. Additional system context for mmWave 5G apparatuses, techniques and features is discussed herein below.

Figure 2:
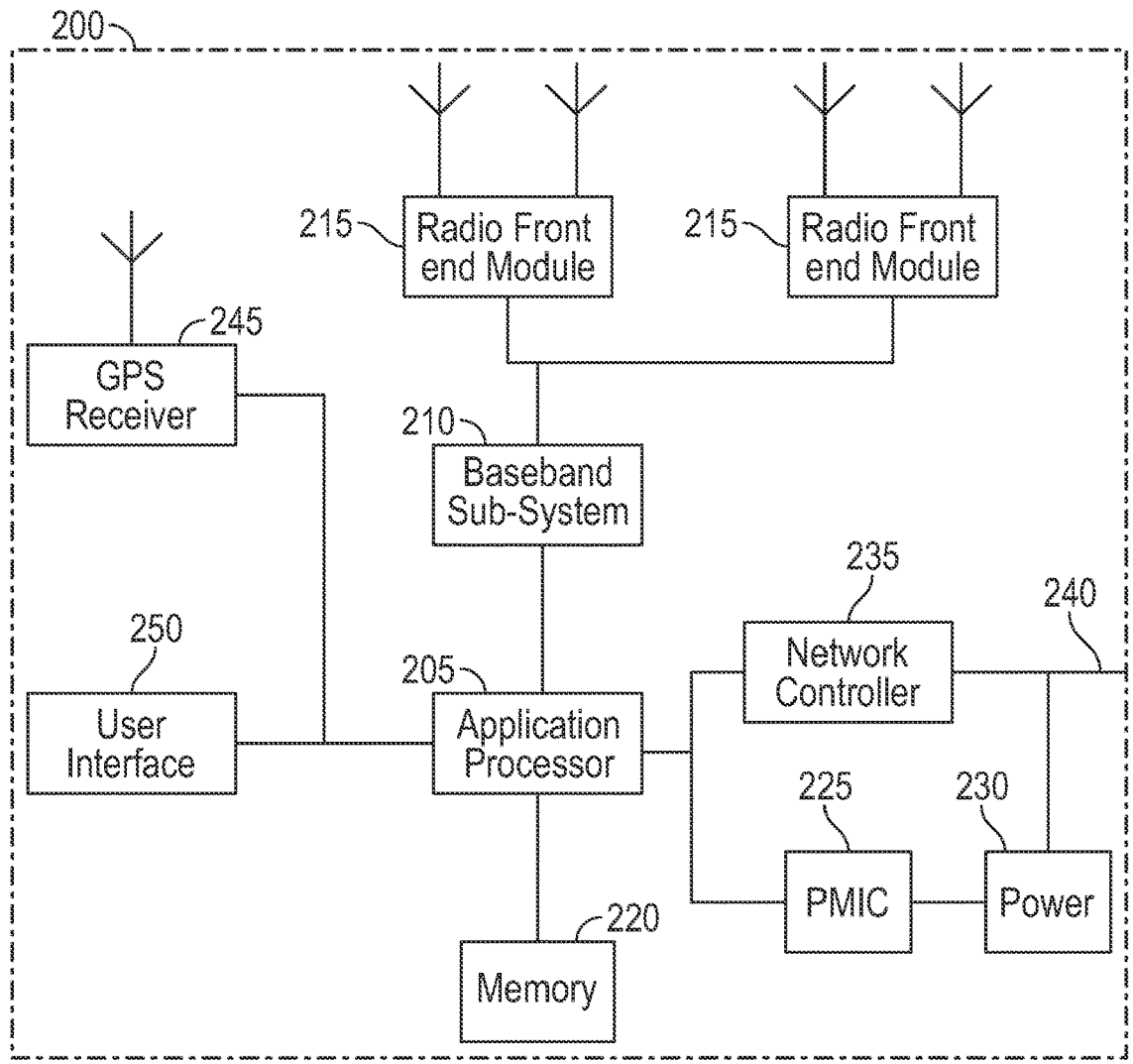
FIG. 2 illustrates an exemplary base station radio head according to some aspects.

FIG. 2 illustrates an exemplary base station or infrastructure equipment radio head according to some aspects. The base station radio head 200 may include one or more of application processor 205, baseband processors 210, one or more radio front end modules 215, memory 220, power management integrated circuitry (PMIC) 225, power tee circuitry 230, network controller 235, network interface connector 240, satellite navigation receiver (e.g., GPS receiver) 245, and user interface 250.

In some aspects, application processor 205 may include one or more CPU cores and one or more of cache memory, low drop-out voltage regulators (LDOs), interrupt controllers, serial interfaces such as SPI, I2C or universal programmable serial interface, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip sub-system including two or more integrated circuits.

In some aspects, memory 220 may include one or more of volatile memory including dynamic random access memory (DRAM) and/or synchronous DRAM (SDRAM), and non-volatile memory (NVM) including high-speed electrically erasable memory (commonly referred to as Flash memory), phase-change random access memory (PRAM), magnetoresistive random access memory (MRAM), and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable. Power tee circuitry 230 may provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide, to application processor 205, data which may include one or more of position data or time data. Time data may be used by application processor 205 to synchronize operations with other radio base stations or infrastructure equipment.

In some aspects, user interface 250 may include one or more of buttons. The buttons may include a reset button. User interface 250 may also include one or more indicators such as LEDs and a display screen.

Figure 3A:
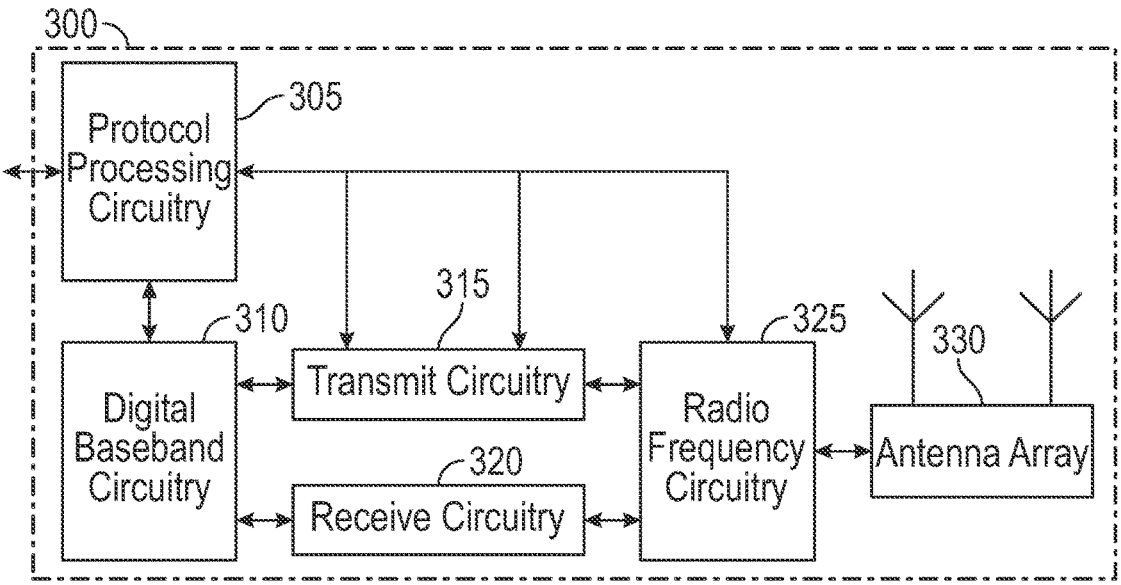
FIG. 3A illustrates exemplary wireless communication circuitry according to some aspects.
Figure 3B:
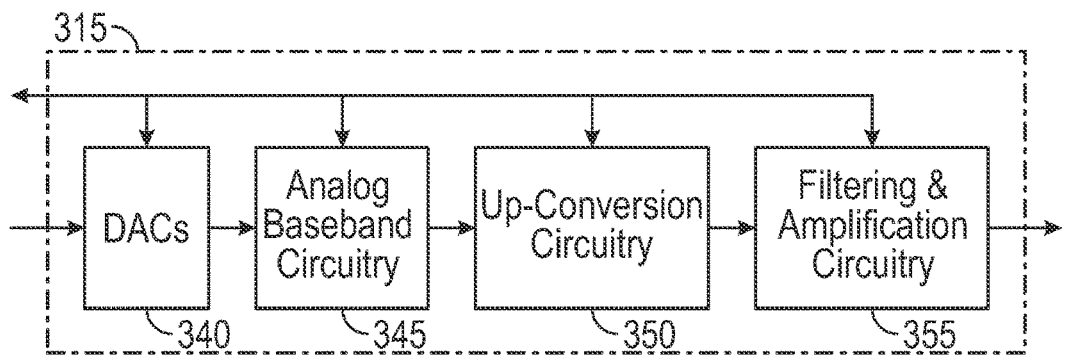
FIG. 3B illustrates aspects of exemplary transmit circuitry illustrated in FIG. 3A according to some aspects.
Figure 3C:
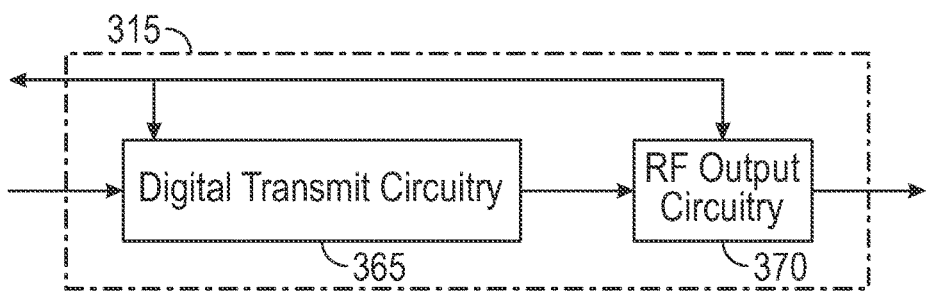
FIG. 3C illustrates aspects of exemplary transmit circuitry illustrated in FIG. 3A according to some aspects.
Figure 3D:
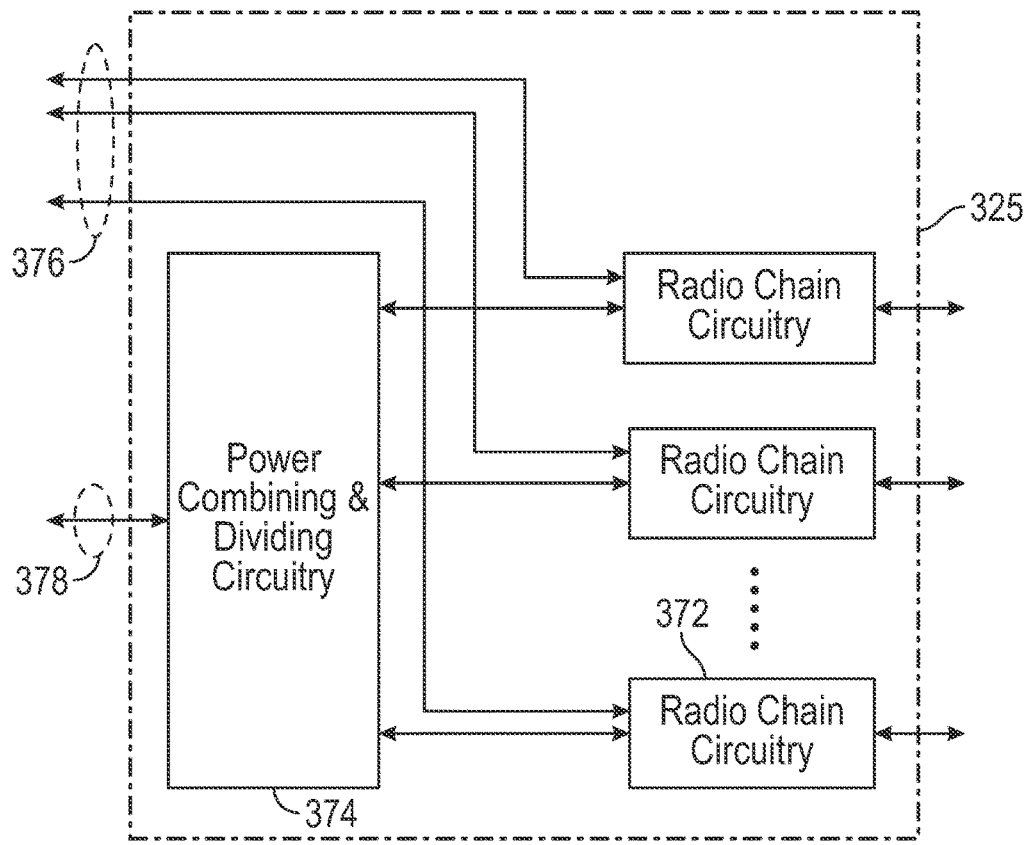
FIG. 3D illustrates aspects of exemplary radio frequency circuitry illustrated in FIG. 3A according to some aspects.
Figure 3E:
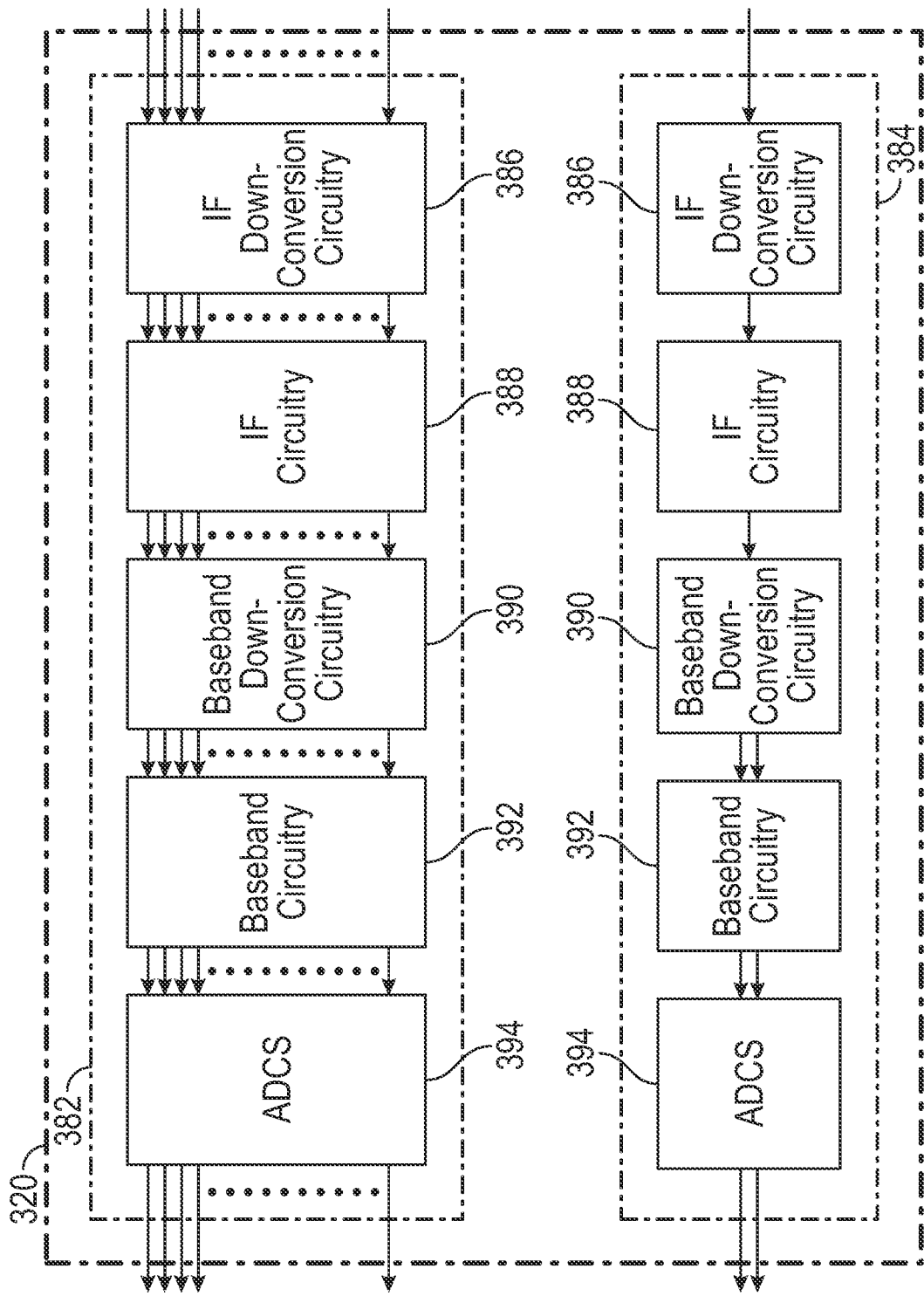
FIG. 3E illustrates aspects of exemplary receive circuitry in FIG. 3A according to some aspects.

FIG. 3A illustrates exemplary wireless communication circuitry according to some aspects; FIGS. 3B and 3C illustrate aspects of transmit circuitry shown in FIG. 3A according to some aspects; FIG. 3D illustrates aspects of radio frequency circuitry shown in FIG. 3A according to some aspects; FIG. 3E illustrates aspects of receive circuitry in FIG. 3A according to some aspects. Wireless communication circuitry 300 shown in FIG. 3A may be alternatively grouped according to functions. Components illustrated in FIG. 3A are provided here for illustrative purposes and may include other components not shown in FIG. 3A.

Wireless communication circuitry 300 may include protocol processing circuitry 305 (or processor) or other means for processing. Protocol processing circuitry 305 may implement one or more of medium access control (MAC), radio link control (RLC), packet data convergence protocol (PDCP), radio resource control (RRC) and non-access stratum (NAS) functions, among others. Protocol processing circuitry 305 may include one or more processing cores to execute instructions and one or more memory structures to store program and data information.

Wireless communication circuitry 300 may further include digital baseband circuitry 310. Digital baseband circuitry 310 may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Wireless communication circuitry 300 may further include transmit circuitry 315, receive circuitry 320 and/or antenna array circuitry 330. Wireless communication circuitry 300 may further include RF circuitry 325. In some aspects, RF circuitry 325 may include one or multiple parallel RF chains for transmission and/or reception. Each of the RF chains may be connected to one or more antennas of antenna array circuitry 330.

In some aspects, protocol processing circuitry 305 may include one or more instances of control circuitry. The control circuitry may provide control functions for one or more of digital baseband circuitry 310, transmit circuitry 315, receive circuitry 320, and/or RF circuitry 325.

FIGS. 3B and 3C illustrate aspects of transmit circuitry shown in FIG. 3A according to some aspects. Transmit circuitry 315 shown in FIG. 3B may include one or more of digital to analog converters (DACs) 340, analog baseband circuitry 345, up-conversion circuitry 350 and/or filtering and amplification circuitry 355. DACs 340 may convert digital signals into analog signals. Analog baseband circuitry 345 may perform multiple functions as indicated below. Up-conversion circuitry 350 may up-convert baseband signals from analog baseband circuitry 345 to RF frequencies (e.g., mmWave frequencies). Filtering and amplification circuitry 355 may filter and amplify analog signals. Control signals may be supplied between protocol processing circuitry 305 and one or more of DACs 340, analog baseband circuitry 345, up-conversion circuitry 350 and/or filtering and amplification circuitry 355.

Transmit circuitry 315 shown in FIG. 3C may include digital transmit circuitry 365 and RF circuitry 370. In some aspects, signals from filtering and amplification circuitry 355 may be provided to digital transmit circuitry 365. As above, control signals may be supplied between protocol processing circuitry 305 and one or more of digital transmit circuitry 365 and RF circuitry 370.

FIG. 3D illustrates aspects of radio frequency circuitry shown in FIG. 3A according to some aspects. Radio frequency circuitry 325 may include one or more instances of radio chain circuitry 372, which in some aspects may include one or more filters, power amplifiers, low noise amplifiers, programmable phase shifters and power supplies.

Radio frequency circuitry 325 may also in some aspects include power combining and dividing circuitry 374. In some aspects, power combining and dividing circuitry 374 may operate bidirectionally, such that the same physical circuitry may be configured to operate as a power divider when the device is transmitting, and as a power combiner when the device is receiving. In some aspects, power combining and dividing circuitry 374 may include one or more wholly or partially separate circuitries to perform power dividing when the device is transmitting and power combining when the device is receiving. In some aspects, power combining and dividing circuitry 374 may include passive circuitry including one or more two-way power divider/combiners arranged in a tree. In some aspects, power combining and dividing circuitry 374 may include active circuitry including amplifier circuits.

In some aspects, radio frequency circuitry 325 may connect to transmit circuitry 315 and receive circuitry 320 in FIG. 3A. Radio frequency circuitry 325 may connect to transmit circuitry 315 and receive circuitry 320 via one or more radio chain interfaces 376 and/or a combined radio chain interface 378. In some aspects, one or more radio chain interfaces 376 may provide one or more interfaces to one or more receive or transmit signals, each associated with a single antenna structure. In some aspects, the combined radio chain interface 378 may provide a single interface to one or more receive or transmit signals, each associated with a group of antenna structures.

FIG. 3E illustrates aspects of receive circuitry in FIG. 3A according to some aspects. Receive circuitry 320 may include one or more of parallel receive circuitry 382 and/or one or more of combined receive circuitry 384. In some aspects, the one or more parallel receive circuitry 382 and one or more combined receive circuitry 384 may include one or more Intermediate Frequency (IF) down-conversion circuitry 386, IF processing circuitry 388, baseband down-conversion circuitry 390, baseband processing circuitry 392 and analog-to-digital converter (ADC) circuitry 394. As used herein, the term "intermediate frequency" refers to a frequency to which a carrier frequency (or a frequency signal) is shifted as in intermediate step in transmission, reception, and/or signal processing. IF down-conversion circuitry 386 may convert received RF signals to IF. IF processing circuitry 388 may process the IF signals, e.g., via filtering and amplification. Baseband down-conversion circuitry 390 may convert the signals from IF processing circuitry 388 to baseband. Baseband processing circuitry 392 may process the baseband signals, e.g., via filtering and amplification. ADC circuitry 394 may convert the processed analog baseband signals to digital signals.

FIG. 4 illustrates exemplary RF circuitry of FIG. 3A according to some aspects. In an aspect, RF circuitry 325 in FIG. 3A (depicted in FIG. 4 using reference number 425) may include one or more of the IF interface circuitry 405, filtering circuitry 410, up-conversion and down-conversion circuitry 415, synthesizer circuitry 420, filtering and amplification circuitry 424, power combining and dividing circuitry 430, and radio chain circuitry 435.

FIG. 5A and FIG. 5B illustrate aspects of a radio front-end module (RFEM) useable in the circuitry shown in FIG. 1 and FIG. 2, according to some aspects. FIG. 5A illustrates an aspect of a RFEM according to some aspects. RFEM 500 incorporates a millimeter wave RFEM 505 and one or more above-six gigahertz radio frequency integrated circuits (RFIC) 515 and/or one or more sub-six gigahertz RFICs 522. In this aspect, the one or more sub-six gigahertz RFICs 515 and/or one or more sub-six gigahertz RFICs 522 may be physically separated from millimeter wave RFEM 505. RFICs 515 and 522 may include connection to one or more antennas 520. RFEM 505 may include multiple antennas 510.

FIG. 5B illustrates an alternate aspect of a radio front end module, according to some aspects. In this aspect both millimeter wave and sub-six gigahertz radio functions may be implemented in the same physical radio front end module (RFEM) 530. RFEM 530 may incorporate both millimeter wave antennas 535 and sub-six gigahertz antennas 540.

Figure 6:
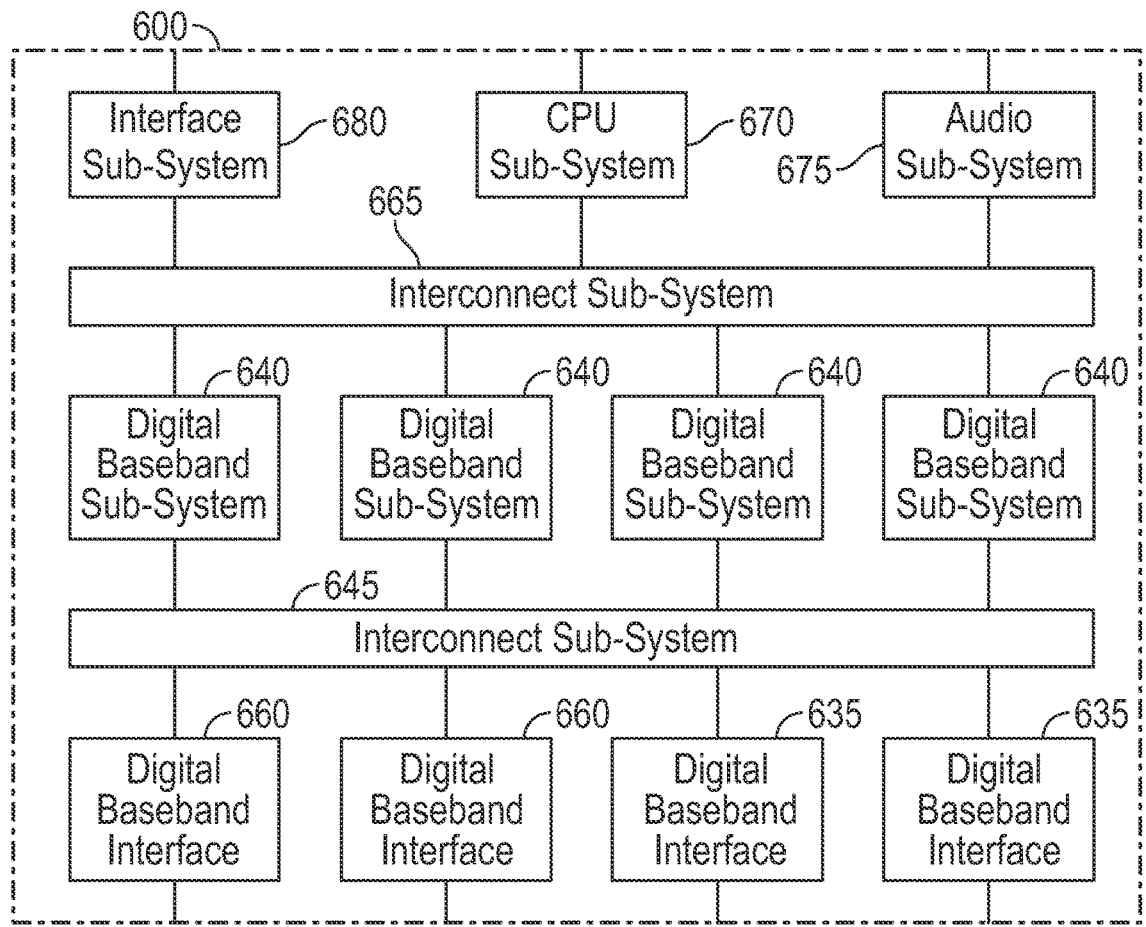
FIG. 6 illustrates an exemplary multi-protocol baseband processor useable in FIG. 1 or FIG. 2, according to some aspects.

FIG. 6 illustrates a multi-protocol baseband processor 600 useable in the system and circuitry shown in FIG. 1 or FIG. 2, according to some aspects. In an aspect, baseband processor may contain one or more digital baseband subsystems 640A, 640B, 640C, 640D, also herein referred to collectively as digital baseband subsystems 640.

In an aspect, the one or more digital baseband subsystems 640A, 640B, 640C, 640D may be coupled via interconnect subsystem 665 to one or more of CPU subsystem 670, audio subsystem 675 and interface subsystem 680. In an aspect, the one or more digital baseband subsystems 640 may be coupled via interconnect subsystem 645 to one or more of each of digital baseband interface 660A, 660B and mixed-signal baseband subsystem 635A, 635B.

In an aspect, interconnect subsystem 665 and 645 may each include one or more of each of buses point-to-point connections and network-on-chip (NOC) structures. In an aspect, audio subsystem 675 may include one or more of digital signal processing circuitry, buffer memory, program memory, speech processing accelerator circuitry, data converter circuitry such as analog-to-digital and digital-to-analog converter circuitry, and analog circuitry including one or more of amplifiers and filters.

Figure 7:
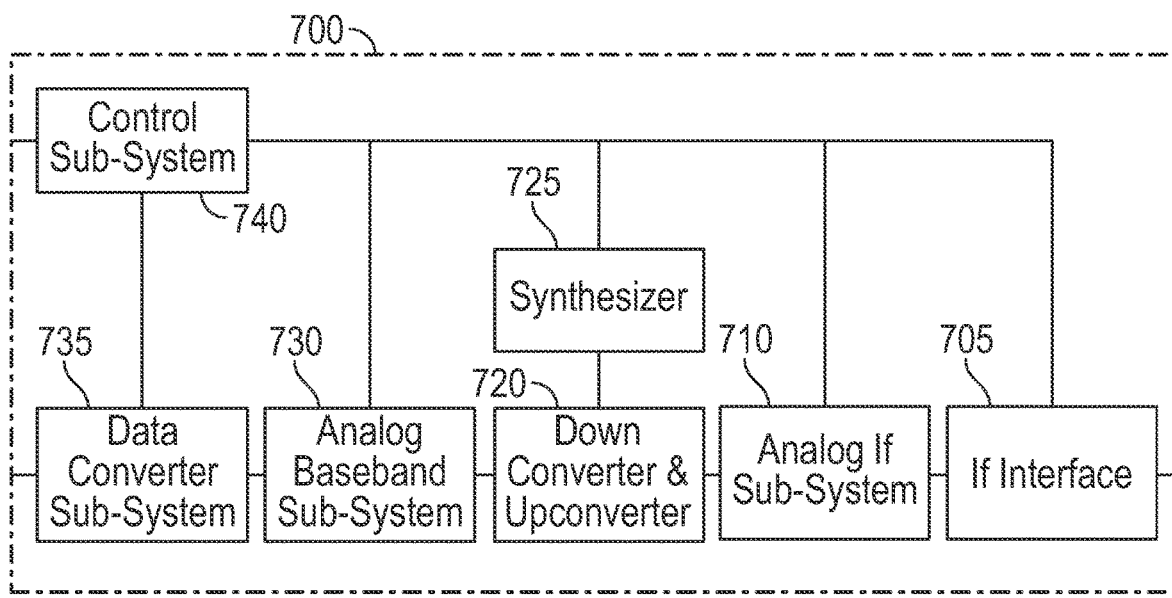
FIG. 7 illustrates an exemplary mixed signal baseband subsystem, according to some aspects.

FIG. 7 illustrates an exemplary of a mixed signal baseband subsystem 700, according to some aspects. In an aspect, mixed signal baseband subsystem 700 may include one or more of IF interface 705, analog IF subsystem 710, down-converter and up-converter subsystem 720, analog baseband subsystem 730, data converter subsystem 735, synthesizer 725 and control subsystem 740.

Figure 8A:
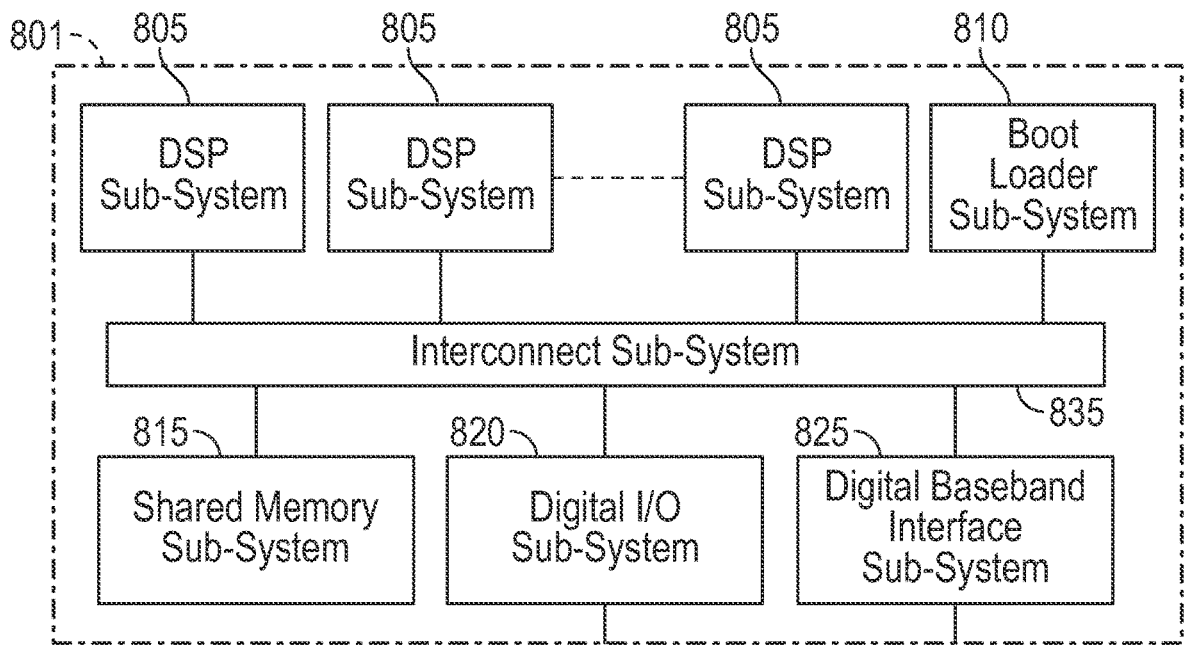
FIG. 8A illustrates an exemplary digital baseband subsystem, according to some aspects.
Figure 8B:
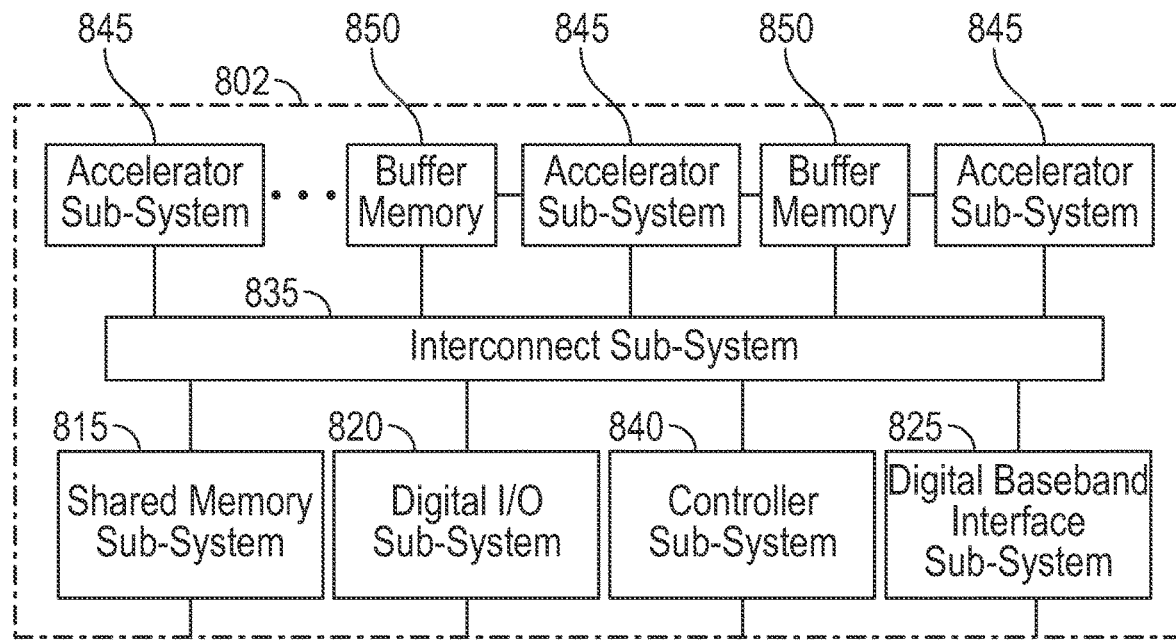
FIG. 8B illustrates an alternate aspect of an exemplary baseband processing subsystem, according to some aspects.

FIG. 8A illustrates a digital baseband processing subsystem 801, according to some aspects. FIG. 8B illustrates an alternate aspect of a digital baseband processing subsystem 802, according to some aspects.

In an aspect of FIG. 8A, the digital baseband processing subsystem 801 may include one or more of each of digital signal processor (DSP) subsystems 805A, 805B, . . . 805N, interconnect subsystem 835, boot loader subsystem 810, shared memory subsystem 815, digital I/O subsystem 820, and digital baseband interface subsystem 825.

In an aspect of FIG. 8B, digital baseband processing subsystem 802 may include one or more of each of accelerator subsystem 845A, 845B, . . . 845N, buffer memory 850A, 850B, . . . 850N, interconnect subsystem 835, shared memory subsystem 815, digital I/O subsystem 820, controller subsystem 840 and digital baseband interface subsystem 825.

In an aspect, boot loader subsystem 810 may include digital logic circuitry configured to perform configuration of the program memory and running state associated with each of the one or more DSP subsystems 805. Configuration of the program memory of each of the one or more DSP subsystems 805 may include loading executable program code from storage external to digital baseband processing subsystems 801 and 802. Configuration of the running state associated with each of the one or more DSP subsystems 805 may include one or more of the steps of: setting the state of at least one DSP core which may be incorporated into each of the one or more DSP subsystems 805 to a state in which it is not running, and setting the state of at least one DSP core which may be incorporated into each of the one or more DSP subsystems 805 into a state in which it begins executing program code starting from a predefined memory location.

In an aspect, shared memory subsystem 815 may include one or more of read-only memory (ROM), static random access memory (SRAM), embedded dynamic random access memory (eDRAM) and/or non-volatile random access memory (NVRAM).

In an aspect, digital I/O subsystem 820 may include one or more of serial interfaces such as Inter-Integrated Circuit (I2C), Serial Peripheral Interface (SPI) or other 1, 2 or 3-wire serial interfaces, parallel interfaces such as general-purpose input-output (GPIO), register access interfaces and direct memory access (DMA). In an aspect, a register access interface implemented in digital I/O subsystem 820 may permit a microprocessor core external to digital baseband processing subsystem 801 to read and/or write one or more of control and data registers and memory. In an aspect, DMA logic circuitry implemented in digital I/O subsystem 820 may permit transfer of contiguous blocks of data between memory locations including memory locations internal and external to digital baseband processing subsystem 801.

In an aspect, digital baseband interface subsystem 825 may provide for the transfer of digital baseband samples between baseband processing subsystem and mixed signal baseband or radio-frequency circuitry external to digital baseband processing subsystem 801. In an aspect, digital baseband samples transferred by digital baseband interface subsystem 825 may include in-phase and quadrature (I/Q) samples.

In an aspect, controller subsystem 840 may include one or more of each of control and status registers and control state machines. In an aspect, control and status registers may be accessed via a register interface and may provide for one or more of: starting and stopping operation of control state machines, resetting control state machines to a default state, configuring optional processing features, and/or configuring the generation of interrupts and reporting the status of operations. In an aspect, each of the one or more control state machines may control the sequence of operation of each of the one or more accelerator subsystems 845. There may be examples of implementations of both FIG. 8A and FIG. 8B in the same baseband subsystem.

Figure 9:
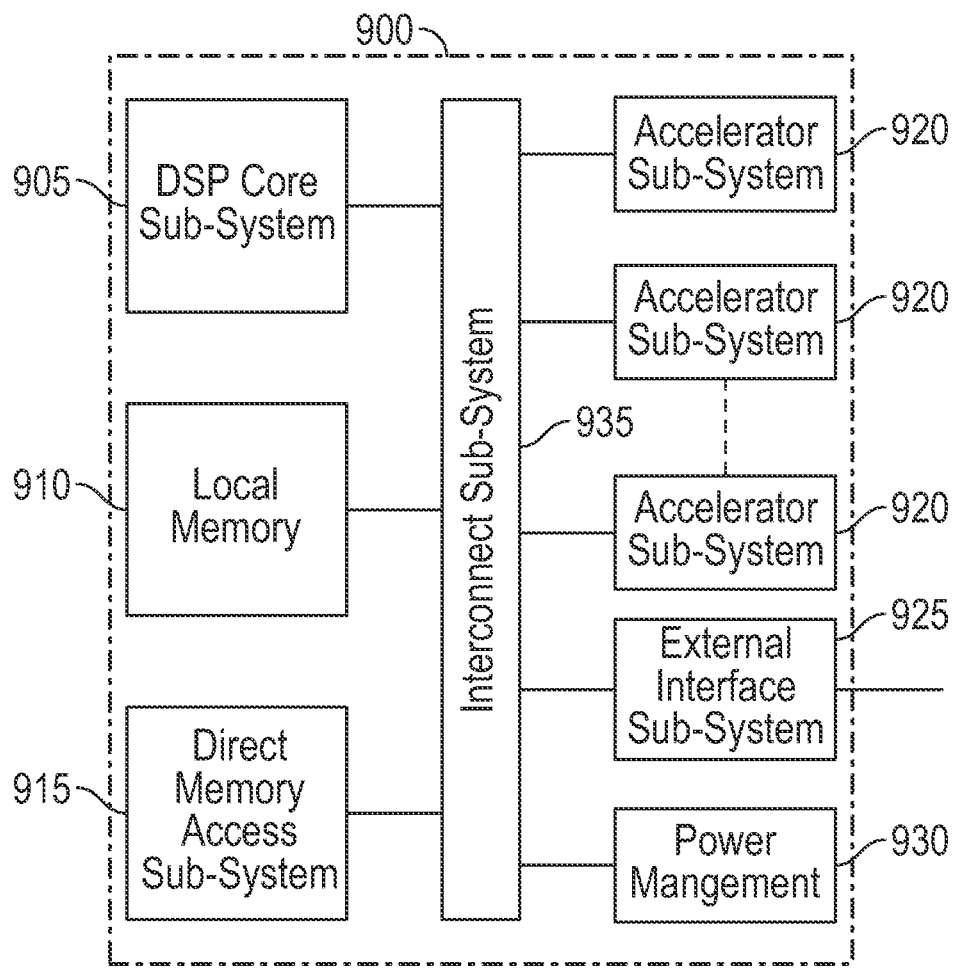
FIG. 9 illustrates an exemplary digital signal processor subsystem, according to some aspects.

FIG. 9 illustrates a digital signal processor (DSP) subsystem 900 according to some aspects. In an aspect, DSP subsystem 900 may include one or more of each of DSP core subsystem 905, local memory 910, direct memory access (DMA) subsystem 915, accelerator subsystem 920A, 920B . . . 920N, external interface subsystem 925, power management circuitry 930 and interconnect subsystem 935.

In an aspect, the local memory 910 may include one or more of each of read-only memory, static random access memory or embedded dynamic random access memory.

In an aspect, the DMA subsystem 915 may provide registers and control state machine circuitry adapted to transfer blocks of data between memory locations including memory locations internal and external to DSP subsystem 900.

In an aspect, external interface subsystem 925 may provide for access by a microprocessor system external to DSP subsystem 900 to one or more of memory, control registers and status registers which may be implemented in DSP subsystem 900. In an aspect, external interface subsystem 925 may provide for transfer of data between local memory 910 and storage external to DSP subsystem 900 under the control of one or more of the DMA subsystems 915 and the DSP core subsystem 905.

Opportunistic Calibration of an Adjustable Oscillator

As described earlier herein, there is a general need for an accurate on-chip oscillator (e.g., RC oscillator or ring oscillator) for use with some RFFE ICs for which expensive, highly accurate oscillators would be inappropriate. Apparatuses according to aspects of the disclosure provide an adjustable oscillator for which no dummy messages are used to create the clocks for on-chip functional circuits. The adjustable oscillator can be frequently re-calibrated as a background procedure during SPI or other serial control protocol commands, so that the adjustable oscillator remains accurate over temperature. The oscillator is activated only when needed, however, thus saving power. As a result, additional clocks can be provided for on-chip functions without a PLL or permanent external clock feed.

Figure 10:
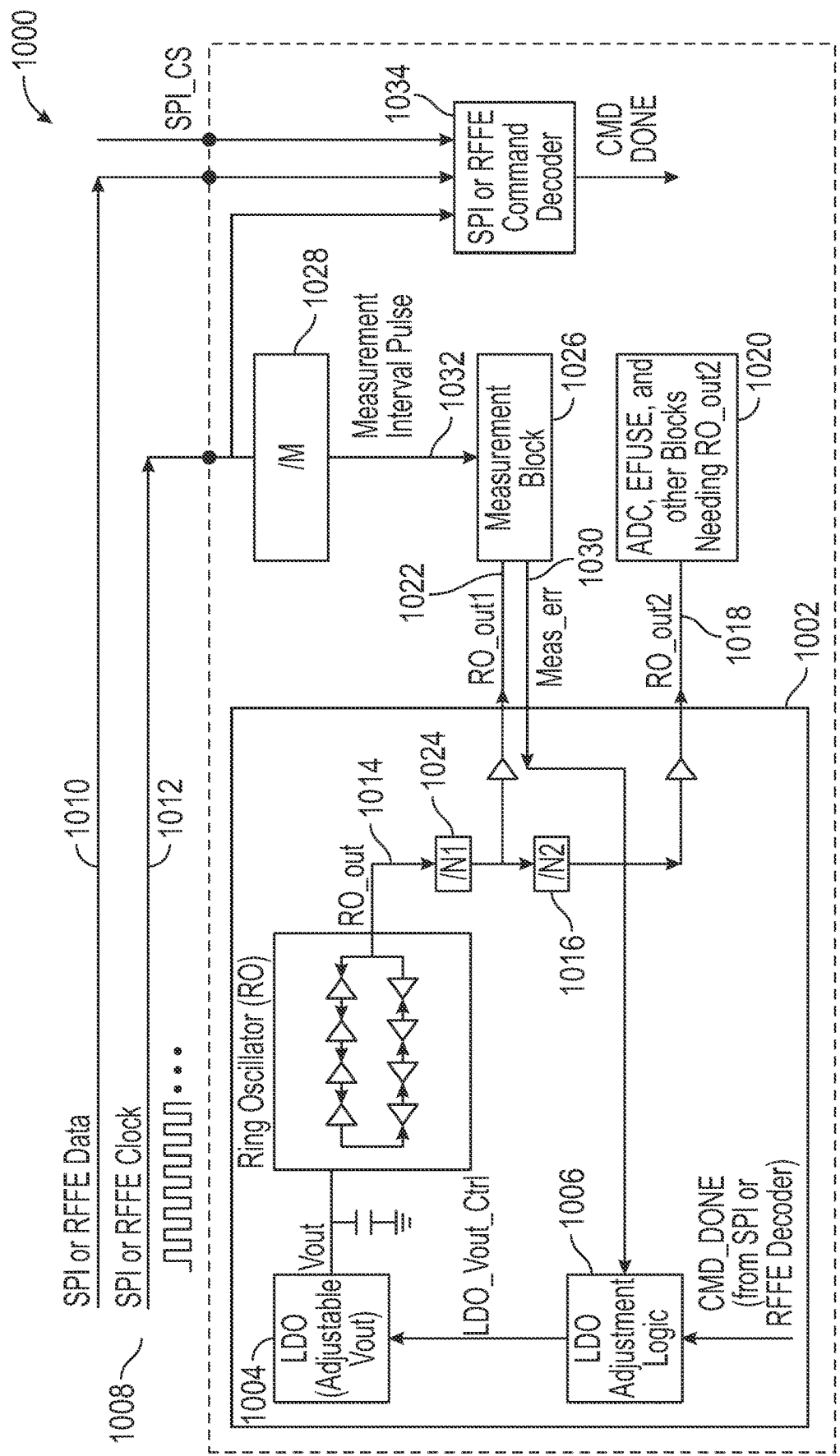
FIG. 10 illustrates a block diagram of an oscillator circuit in which an oscillator is calibrated using low dropout regulator (LDO) adjustment according to some aspects.

FIG. 10 illustrates a block diagram of an oscillator circuit 1000 in which an oscillator 1002 is calibrated using low dropout regulator (LDO) 1004 adjustment and adjustment circuitry 1006 according to some aspects. The oscillator circuit 1000 can be included in mmWave beamformer chips, and other RFFE chips such as power amplifiers as described earlier herein, and other components of these chips were described with reference to FIG. 1-9 and are not further discussed with respect to FIG. 10.

The oscillator circuit 1000 can include an interface 1008 to receive a SPI command (or other command) 1010, although embodiments are not limited to serial protocol commands or to serial interfaces. These commands are sent based on a precise clock that generates a SPI clock 1012 waveform, for example, although embodiments are not limited to SPI or SPI clocks and can include other protocol clocks that have guaranteed precision.

The oscillator 1002 can operate in a low GHz range (e.g., less than about 20 GHz), with the output 1014 divided down for functional use by, for example, divider 1016 to provide an output 1018 for other circuitry 1020 needing an oscillator signal, for example, ADC circuitry, EFUSE circuitry, etc. For purposes of precise comparison in methods according to some aspects, a divider output signal 1022 of divider 1024 can provide a higher frequency output (e.g., the divider 1024 may divide by a smaller integer than that used by divider 1016).

The oscillator 1002 may be enabled only upon reception of a specific command. For example, the oscillator 1002 may remain disabled, and be enabled responsive to a SPI chip select being asserted, although aspects are not limited to any particular command or to any particular protocol. Responsive to the specific command being asserted, divider output signal 1022 is fed to measurement circuitry 1026.

As each SPI command 1010 or other RFFE data is received, a prescaler 1028 can provide a measurement interval pulse 1032 (described in more detail later herein) to the measurement circuitry 1026. The measurement circuitry 1026 will count a number of cycles of the divider output signal 1022 for an amount of time and based on the frequency of the SPI clock 1012, wherein that amount of time can be programmed based on a number of SPI clocks that are guaranteed to be present in the SPI command, e.g., 16 or 32 clocks. Because the SPI or MIPI RFFE clock is typically generated by a baseband IC with a precise timing source, the SPI clock and frequency can be very accurate, on the order of about +/−5 ppm accuracy.

Measurement circuitry 1026, can receive the divider output signal 1022 of the oscillator 1002 and to measure oscillator error 1030 by comparing the divider output signal 1022 of the oscillator 1002 to a nominal frequency for an amount of time. The measurement circuitry 1026 can comprise a phase detector to perform the comparison. For example, the phase detector can compare the divider output signal 1022 of the oscillator 1002 to a SPI clock 1012 provided over a serial interface, or frequency derived therefrom. In other aspects, the measurement circuitry 1026 can comprise a period measurement circuit configured to detect a number of clock transitions of the oscillator 1002 or derived frequencies. The number of clock transitions to be measured can be based on the SPI clock 1012. Further details regarding the measurement circuitry 1026 are provided with respect to FIG. 11 later herein.

The amount of time over which measurements are made can be determined based on a number of clock cycles of the SPI command 1010 (or other command). For example, the nominal frequency can be based on SPI clock 1012 for the SPI or other protocol interface, and the amount of time can be based on the number of clock cycles used for the received command, according to protocol specifications, plus some buffer amount of time in some aspects.

Adjustment circuitry 1006 can adjust the oscillator 1002 frequency based on the measured oscillator error 1030. For example, the adjustment circuitry 1006 can adjust the ring oscillator frequency (which increases/decreases in the same direction as the LDO voltage) to reduce the frequency error of the oscillator 1002 to zero or near-zero. Adjustment circuitry 1006 can translate the measurement error 1030 into a data word, for example, to be programmed into the LDO 1004, to adjust the LDO 1004 voltage higher or lower to produce a higher or lower oscillator 1002 frequency, wherein a higher voltage output by the LDO 1004 produces a proportionately higher frequency at the oscillator 1002. In an aspect, the adjustment circuitry 1006 can process only the sign of the measurement error 1030, such that if measurement error 1030 is greater than zero, the oscillator 1002 frequency should be set lower by decreasing LDO 1004 voltage. Conversely, if the measurement error 1030 is less than zero, the oscillator 1002 frequency can be set higher, by increasing LDO 1004 voltage.

In some aspects, measurement and adjustment can occur periodically in an oscillator calibration phase, for example based on reception of a SPI command or other protocol command that is received every 25 milliseconds (or with any other periodicity). Measurement of the oscillator error 1030 can occur periodically every 25 milliseconds and the oscillator 1002 frequency can be thereby adjusted about every 25 milliseconds in the illustrated example. This provides periodic adjustment of oscillator 1002 frequency in a background process without further intervention by processing circuitry or upper-layer processes.

The protocol command that is used in oscillator 1002 calibration can include any command that is specific to control of an integrated circuit related to or coupled to the oscillator 1002, such as a chip select signal from an SPI command, detection of a Sequency Start Condition (SSC) used for starting of a MIPI RFFE command, receive or transmit enable commands, receive or transmit disable commands, etc. Measurement and adjustment of the oscillator 1002 can occur based on reception of any of those protocol commands. Measurement and adjustment can also occur based on reception of a request for power measurement or a request for a temperature measurement, among other preselected commands, periodic commands, etc.

In other aspects, different frequencies derived from or related to the oscillator 1002 frequency can be adjusted by modifying the value of divider/N1 in 1024.

The oscillator 1002 can remain enabled for a duration subsequent to a last clock cycle of the serial protocol command and terminate operation after the duration. For example, when a measurement needing N clock cycles needs to be performed by an IC that is using the oscillator 1002, the oscillator 1002 can stay on for N clock cycles subsequent to the last cycle of the relevant serial (or other protocol) command that had initiated the calibration/adjustment of the oscillator 1002. In at least these aspects, the oscillator 1002 can continue to provide output 1018 to functions of the block 1020 for at least those N clock cycles. In other aspects, the oscillator 1002 can be disabled subsequent to the last clock cycle of the serial protocol command.

By way of illustrative example of the above-described measurement and adjustment process, given a 2 GHz ring oscillator 1002, divider 1024 may divide the ring oscillator output to give a divider output signal 1022 of 500 MHz Given the SPI clock (or other reference clock) 1012 is 38.4 MHz, and the amount of time of the measurement is 32 periods of the SPI clock 1012, then 416 or 417 counts should be counted by the measurement circuitry 1026 (wherein a count is a certain edge transition in the command waveform, e.g., a rising edge transition or a falling edge transition). The oscillator error 1030 can be expressed as a percentage or as a number, and adjustment circuitry 1006 can adjust the oscillator frequency by the derived percentage or number.

In aspects described above, the LDO 1004 output voltage can be reprogrammed to re-center the oscillator 1002, based on lookup tables or other data that relates frequency sensitivity of the oscillator 1002 to LDO 1004 voltage.

The oscillator circuit 1000 includes a command decoder 1034 to decode, e.g., SPI or MIPI RFFE commands, although aspects are not limited to any particular command protocol. The decoded commands are used to control the IC (not shown in FIG. 10) according to command protocols and IC standards.

Figure 11:
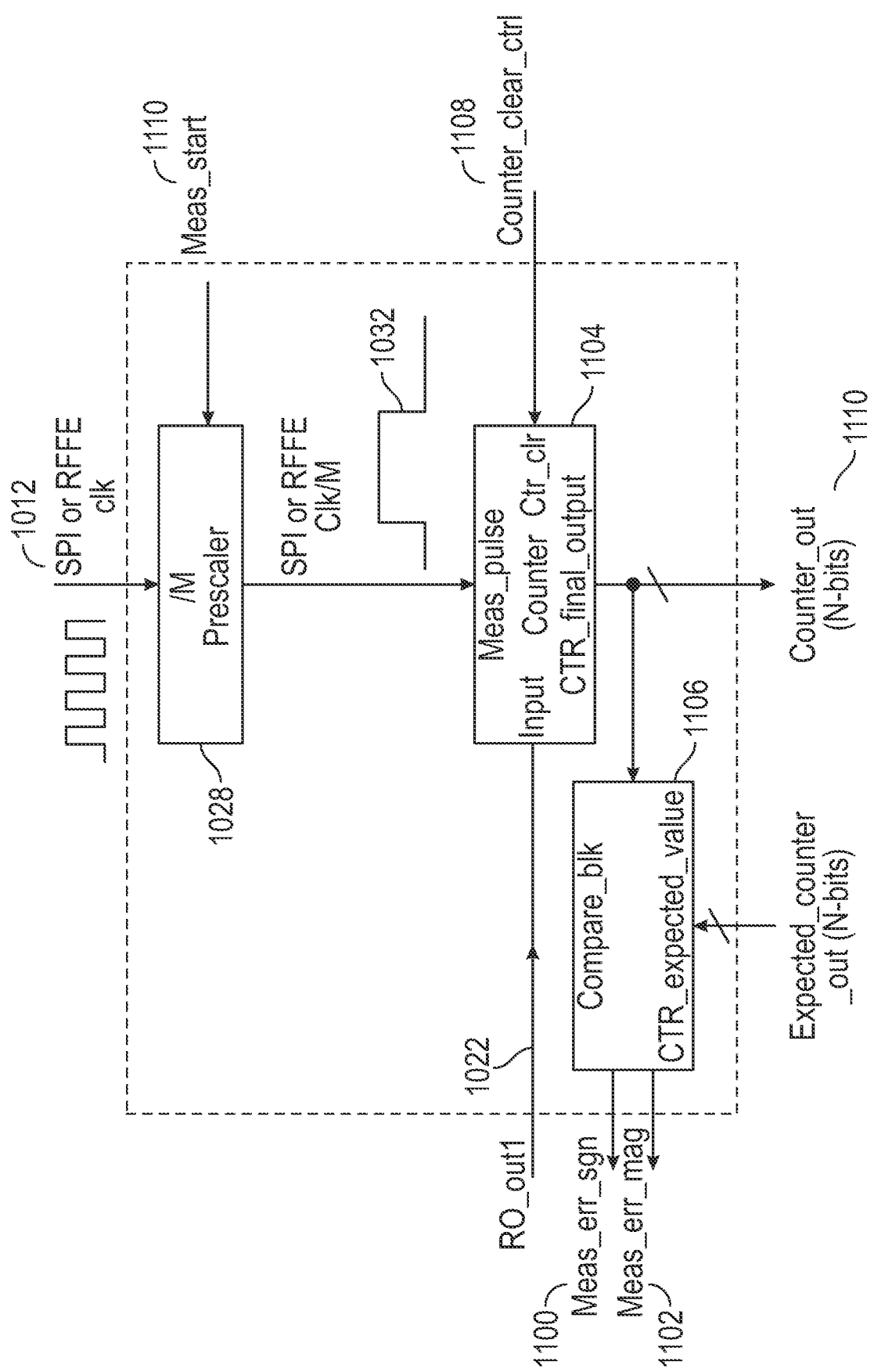
FIG. 11 is a detailed block diagram of measurement circuitry of a system in which an oscillator is calibrated according to some aspects.

FIG. 11 is a detailed block diagram of measurement circuitry 1026 of an oscillator circuit 1000 in which an oscillator 1002 is calibrated according to some aspects. The measurement error 1030 (FIG. 10) has been split into a measurement error sign 1100 and a measurement error magnitude 1102. Furthermore, the measurement circuitry 1026 (FIG. 10) has been split into a counter 1104 and comparison block 1106 for purposes of additional explanation of the functionality of the measurement circuitry 1026.

The divider output signal 1022 is provided to a counter 1104. The divider output signal 1022 is then counted for M periods of the slower SPI or MIPI RFFE clock as provided in signal 1108 output from prescaler 1028, responsive to a measurement interval pulse 1032 indicating that measurement is to be performed. After M periods are seen by the prescaler 1028, the measurement interval pulse 1032 will go low, terminating the counter 1104 measurement.

The compare block 1106 is assumed to be pre-loaded with an expected count value according to the nominal frequency of the oscillator 1002. As described above with reference to FIG. 10, given an example expected count with M=32 is 417, rounded up from the exact value of 416.7. If the measured count is 410, then a measurement error magnitude 1102 will be 7 (e.g., a 1.67% period error) and measurement error sign 1100 is negative meaning that the actual oscillator 1002 value is low versus the nominal frequency. The counter 1104 can be cleared for a next subsequent measurement and calibration operation using signal 1108, and the counter 1104 value can be output in signal 1110.

Figure 12:
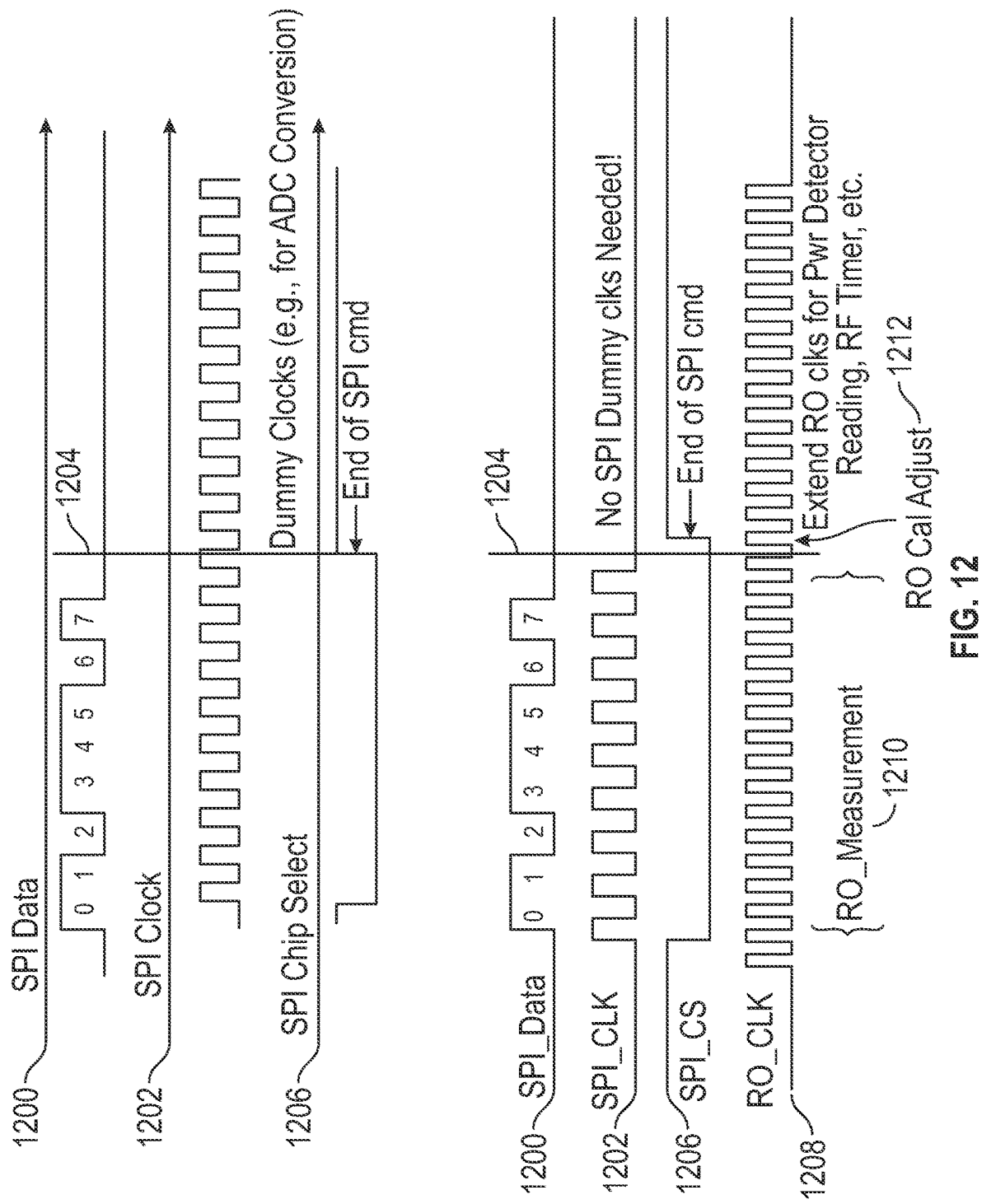
FIG. 12 illustrates clock signals according to some aspects.

FIG. 12 illustrates clock signals according to some aspects. The top half of FIG. 12 indicates clock signals in available systems, for purpose of comparison with clock signals according to aspects of the disclosure, shown in the lower half of FIG. 12. Waveform 1200 is a data signal (e.g., a SPI command signal, although embodiments are not limited thereto) that can be passed to a standard command decoder block (e.g., block 1034 (FIG. 10). Waveform 1202 indicates a clock signal, which can have guaranteed precision, and can include a SPI clock (although embodiments are not limited thereto). As can be appreciated by comparing the top half of FIG. 12 to the bottom half of FIG. 12, after point 1204, dummy clock signals appear in the upper half, while dummy clock signals are not included in the lower half (e.g., in a clock signal according to aspects of the disclosure). Inclusion of the dummy clock signals is provided in current systems so that a related RFFE IC can complete tasks, as described earlier herein, that use oscillator timing. Inclusion of these dummy clock signals increases overhead and reduces bandwidth of the RFFE IC. Furthermore, the dummy clock signals may not offer sufficient precision in timing, which can lead to problems with some operations, particularly lengthy operations in which thousands of clock cycles are needed (e.g., EFUSE programming or reading operations).

In contrast, in the lower half of FIG. 12, upon assertion of a command (e.g., a SPI chip select command, although aspects are not limited to the chip select command or to SPI commands), the oscillator clock 1208 is initiated (in place of the dummy clock of available systems). Measurement, such as performed by measurement circuitry as described above with reference to FIG. 10-11, is performed during interval 1210, and the oscillator clock 1208 can provide the clock for the on-chip operations including ADC, power detector readout, RF timer, etc. subsequent to termination or de-assertion of the command 1206. Calibration may be performed subsequent to termination or de-assertion of the command 1206, according to operations described above with reference to FIG. 10 and FIG. 11.

Figure 13:
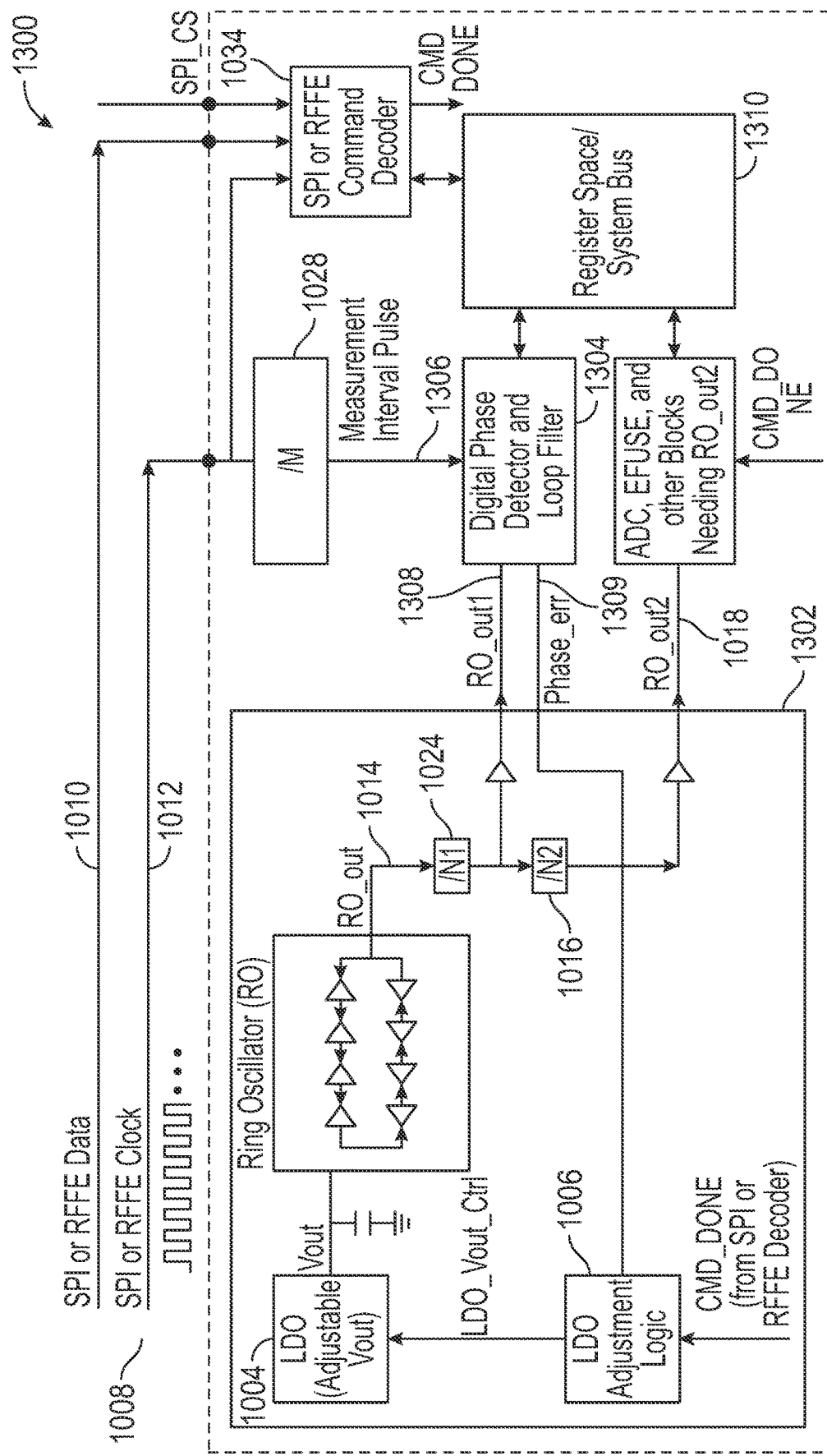
FIG. 13 illustrates a block diagram of a system in which an oscillator is calibrated using a digital phase detector and a loop filter according to some aspects.

FIG. 13 illustrates a block diagram of a system 1300 in which an oscillator 1302 is calibrated using a digital phase detector and loop filter circuitry 1304 according to some aspects. Only components that are different than those shown in FIG. 10 will be discussed with reference to FIG. 13.

In at least these aspects, the digital phase detector and loop filter circuitry 1304 can compare the pre-scaled SPI clock 1306 with the divided-down oscillator signal 1308 and generate phase errors 1309 to provide continual adjustment, with the magnitude of the phase error determining the degree and direction of the LDO adjustment required. In at least these aspects, calibration can be executed upon power up of the relevant RFFE chip so that subsequent oscillator 1302 adjustments can be reduced or minimized. LDO voltage can be controlled and adjusted similarly to that described above with respect to FIG. 10, except values can be stored in register 1310 for subsequent adjustments and for subsequent power-ons of the RFFE chip. In at least this aspect, the calibration and adjustments are closed-loop relative to the aspect described with respect to FIG. 10. In some aspects, calibration and adjustment can run continuously in such a closed-loop configuration. In some aspects, including aspects described with reference to FIG. 10 and FIG. 13, calibration at the beginning of the SPI message can be disabled. For example, calibration may be disabled if temperature has stabilized, or if the magnitude of the measured error is small or switches frequently between a positive and negative error.

In some aspects, the divider values (e.g., the values used in the divider 1024 to divide the oscillator output 1014) can be modified, instead of modifying the oscillator 1002 frequency through LDO adjustment. At least these aspects have an advantage of being fully-digital, in that no adjustable LDO is used.

Figure 14:
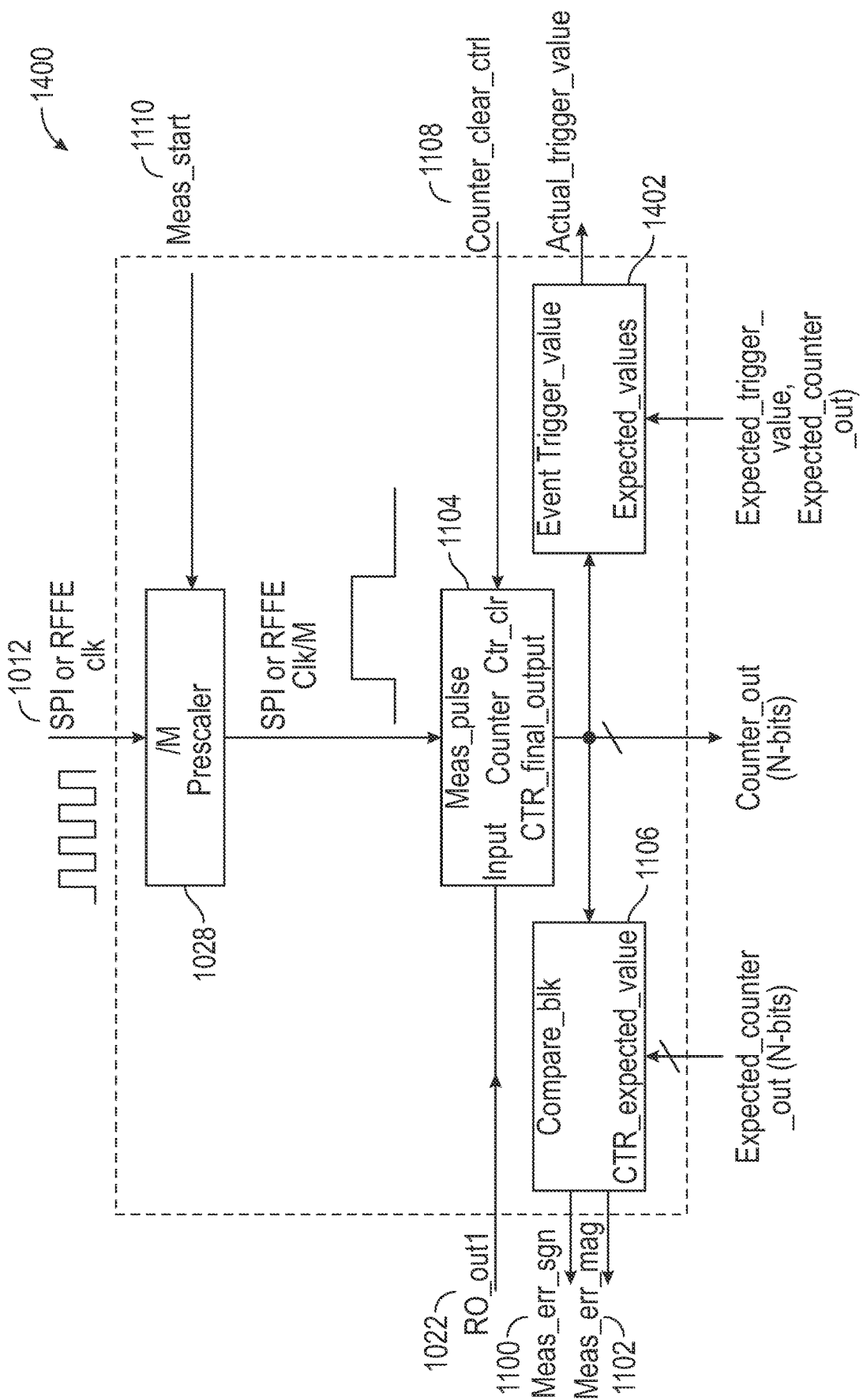
FIG. 14 is a detailed block diagram of measurement circuitry for a precise RF event trigger setting mechanism according to some aspects.

FIG. 14 is a detailed block diagram of measurement circuitry 1400 for a precise RF event trigger setting mechanism according to some aspects. Only components that are different than those shown in FIG. 11 will be discussed with reference to FIG. 14.

In some systems for which LDO 1004 (FIG. 10) steps are limited, oscillator 1002 variation can be in excess of +/−20%, and calibration accuracy as described herein can be limited in accuracy due to the limited LDO 1004 adjustment range. For example, with 32 LDO steps and a +/−20% total oscillator variation, the oscillator adjustment step (assuming oscillator frequency varies directly with voltage), is 40/32=1.25%. In systems that set an RF event trigger after the 10th symbol in a 14-symbol 3GPP slot with SCS=120 kHz, (corresponding to a 125 psec slot time), the timing error could be (0.0125/2)*125 psec*(10/14)=558 nsec. In at least these situations, the error may be too high for the oscillator 1002 to be used for a TX-to-RX transition.

Aspects of the disclosure address these and other concerns by incorporation of an event trigger block 1402. In aspects, an expected event trigger value (in RO_out1 clock cycles) is pre-loaded, along with the expected counter out when the calibration runs for, e.g., 32 SPI clock cycles. After the measurement, which can occur similarly to the process described above with respect to FIG. 11, the percent error of the RO_out1 frequency can be applied to the event trigger block 1402, using a high-precision fixed point multiplication. For example, if RO_out1=500 MHz, and is used to time the RF event that will occur after the calibration completes, then the accuracy will be on the order of +/−1*(1/500 MHz) =+/−2 nsec. This accuracy is suitable for an RF event such as TX-to-RX transition. In some aspects in which precise RF events are scheduled, the oscillator 1002 will not need to be adjusted or calibrated or will only be performed infrequently or intermittently.

Figure 15:
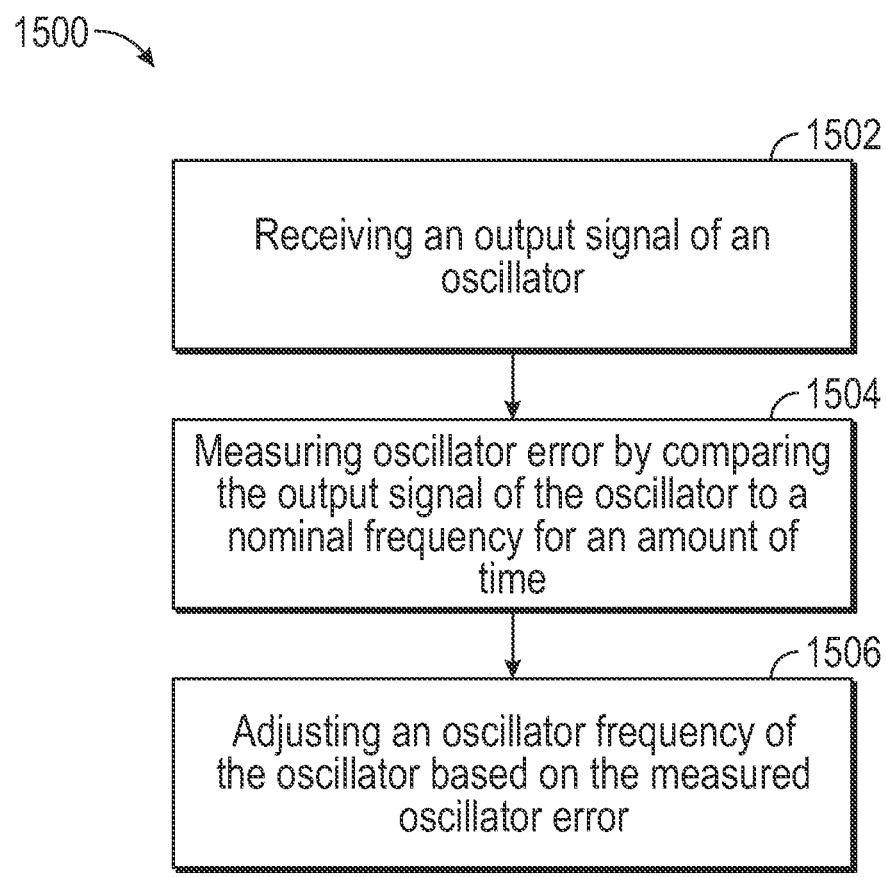
FIG. 15 illustrates a flow diagram of a method for operating an oscillator according to some aspects.

FIG. 15 illustrates a flow diagram of a method 1500 for operating an oscillator according to some aspects. The method 1500 can be performed by, for example, measurement circuitry 1026 (FIG. 10), adjustment circuitry 1006 (FIG. 10 and FIG. 13), digital phase detector and loop filter circuitry 1304 (FIG. 13) or other another component of FIG. 10-14.

Method 1500 can begin with operation 1502 with measurement circuitry 1026 receiving an output signal (e.g., signal 1022 (FIG. 10) of an oscillator 1002.

Method 1500 can continue with operation 1504 with measurement circuitry 1026 measuring oscillator error 1030 by comparing the output signal 1022 of the oscillator 1002 to a nominal frequency for an amount of time. Operation 1504 can include determining the amount of time over which to measure oscillator error 1030 based on a number of clock cycles of a reference control command.

Method 1500 can continue with operation 1506 with adjusting an oscillator frequency of the oscillator 1002 based on the measured oscillator error 1030. In some aspects, method 1500 the measuring operation 1504 and adjusting operation 1506 can be performed periodically, upon startup of the wireless communication device or in any other interval or in response to any other command or request.

Method 1500 can further comprise receiving at least one of a reference control command and a clock signal over a serial communications interface 1008.

Method 1500 can further comprise operating additional circuitry 1020 (e.g., ADC circuitry or fuse circuitry) based on the output signal 1014 of the oscillator. In examples, this signal 1014 can be divide down as described above, e.g., signal 1018 can be used to operate additional circuitry 1020. In some aspects, the oscillator 1002 can be terminated after a time period subsequent to the reference control command.

As described herein, systems and apparatuses provide an oscillator for timing in RFFE circuits that can use more accurate timing, but for which highly-precise clocks would be inappropriate due to the cost and other factors. Oscillators according to aspects can be calibrated or adjusted during operation of the relevant RFFE circuit to provide increased precision and accuracy in various operating conditions such as increased temperature.

With a precisely adjustable oscillator on-chip, an RF timer with good short-term accuracy can be provided in some aspects. For example, in a mmWave RFFE for a base station, one control command can be provided per slot, and that control command could initiate transmission activity immediately, but the receive mode would be switched in when a counter driven by the adjustable oscillator matches the pre-scheduled time for the receive transition.

Other Systems and Apparatuses

Figure 16:
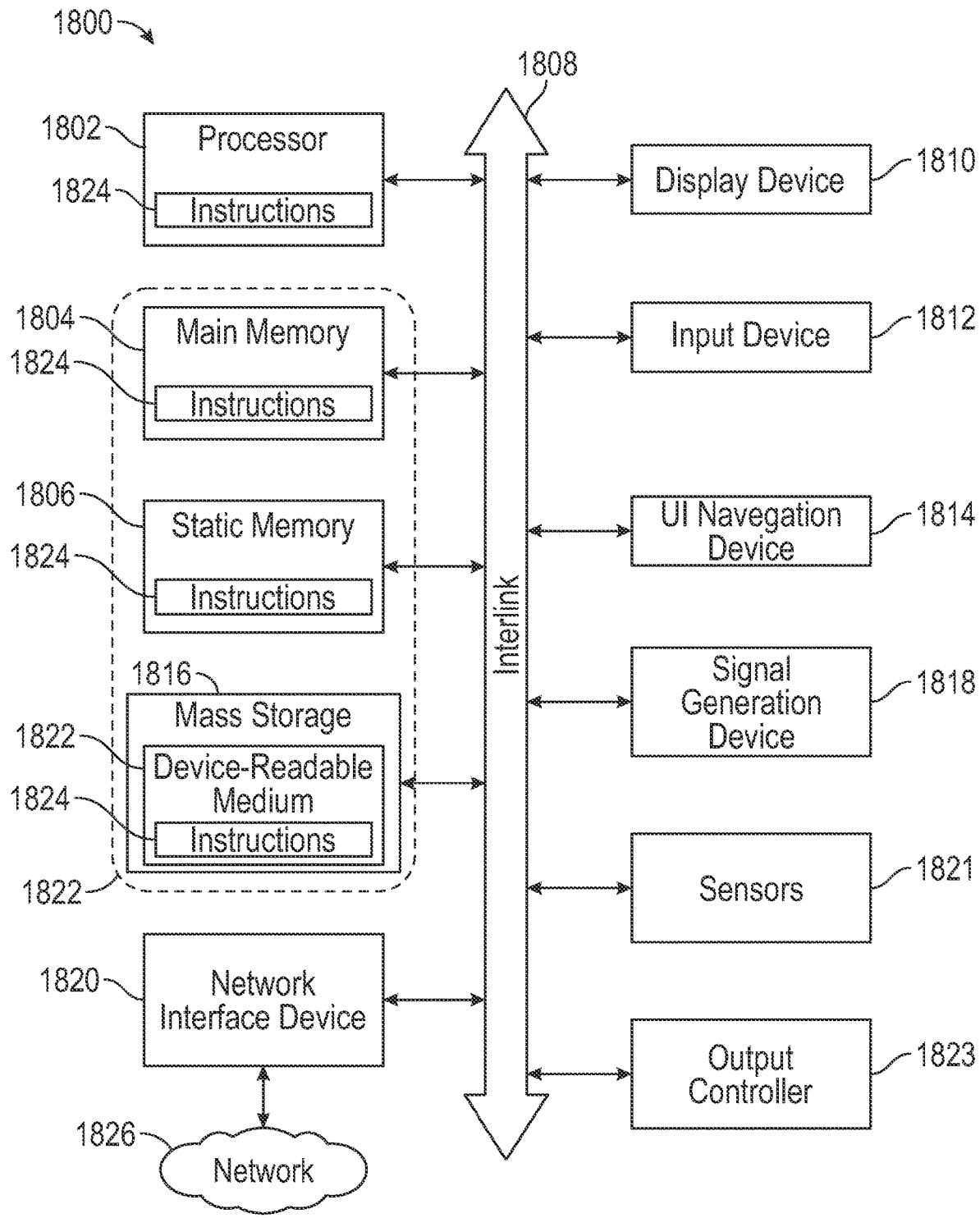
FIG. 16 illustrates a block diagram of a communication device such as an evolved Node-B (eNB), a new generation Node-B (gNB), an access point (AP), a wireless station (STA), a mobile station (MS), or a user equipment (UE), in accordance with some aspects.
Figure 17:
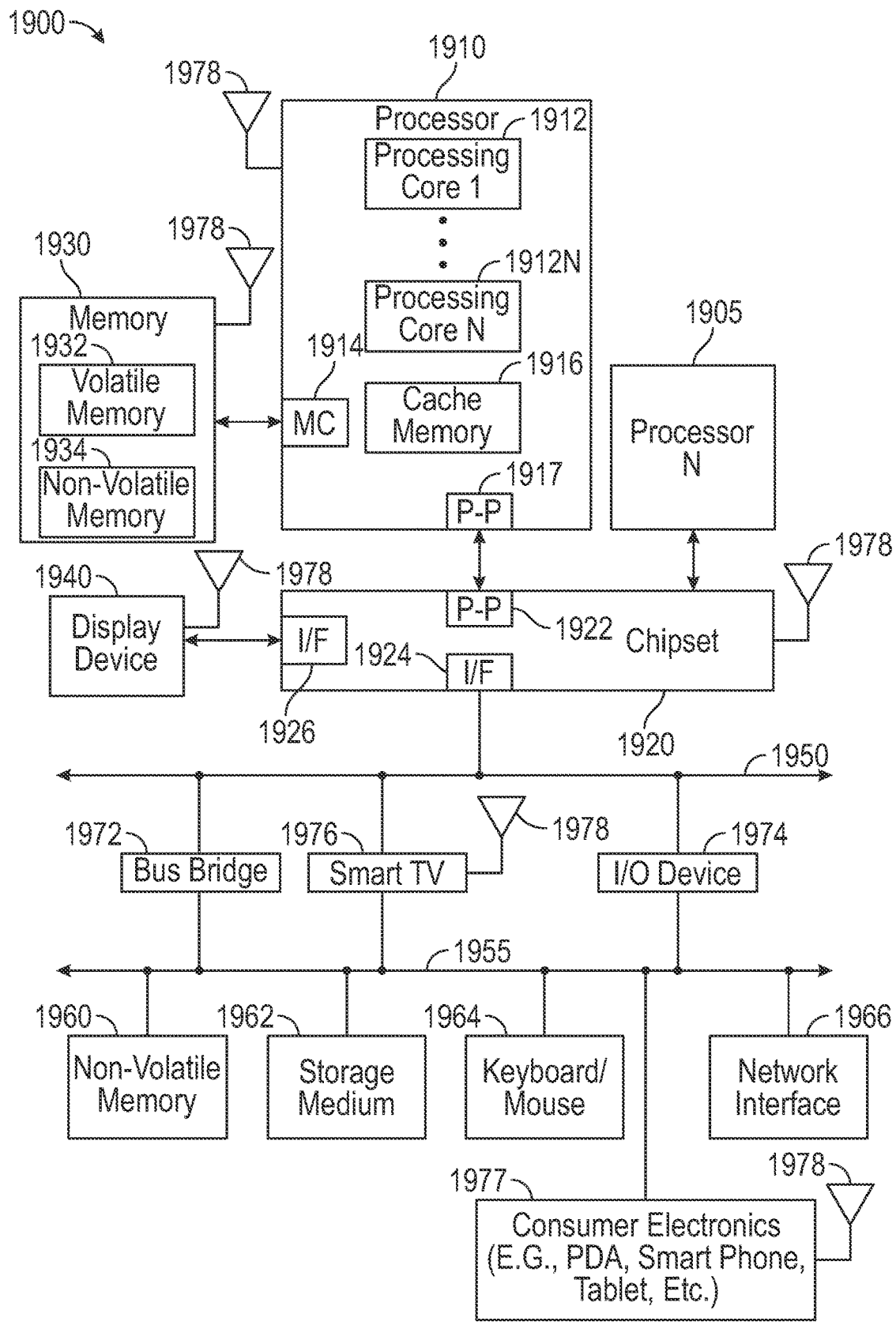
FIG. 17 illustrates a system level diagram, depicting an example of an electronic device (e.g., system) that can include, for example, a transmitter configured to selectively fan out a signal to one of multiple communication channels.

FIG. 16 illustrates a block diagram of a communication device 1800 such as an evolved Node-B (eNB), a new generation Node-B (gNB), an access point (AP), a wireless station (STA), a mobile station (MS), or a user equipment (UE), in accordance with some aspects. In alternative aspects, the communication device 1800 may operate as a standalone device or may be connected (e.g., networked) to other communication devices. In some aspects, the communication device 1800 can use one or more of the techniques and circuits discussed herein, in connection with any of FIG. 1-FIG. 15.

Circuitry (e.g., processing circuitry) is a collection of circuits implemented in tangible entities of the device 1800 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the device 1800 follow.

In some aspects, the device 1800 may operate as a standalone device or may be connected (e.g., networked) to other devices. In a networked deployment, the communication device 1800 may operate in the capacity of a server communication device, a client communication device, or both in server-client network environments. In an example, the communication device 1800 may act as a peer communication device in peer-to-peer (P2P) (or other distributed) network environment. The communication device 1800 may be a UE, eNB, PC, a tablet PC, a STB, a PDA, a mobile telephone, a smart phone, a web appliance, a network router, switch or bridge, or any communication device capable of executing instructions (sequential or otherwise) that specify actions to be taken by that communication device. Further, while only a single communication device is illustrated, the term "communication device" shall also be taken to include any collection of communication devices that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a communication device-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Communication device (e.g., UE) 1800 may include a hardware processor 1802 (e.g., a central processing unit (CPU), a graphics processing unit (GPU), a hardware processor core, or any combination thereof), a main memory 1804, a static memory 1806, and mass storage 1816 (e.g., hard drive, tape drive, flash storage, or other block or storage devices), some or all of which may communicate with each other via an interlink (e.g., bus) 1808.

The communication device 1800 may further include a display unit 1810, an alphanumeric input device 1812 (e.g., a keyboard), and a user interface (UI) navigation device 1814 (e.g., a mouse). In an example, the display unit 1810, input device 1812 and UI navigation device 1814 may be a touch screen display. The communication device 1800 may additionally include a signal generation device 1818 (e.g., a speaker), a network interface device 1820, and one or more sensors 1821, such as a global positioning system (GPS) sensor, compass, accelerometer, or other sensor. The communication device 1800 may include an output controller 1828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1816 may include a communication device-readable medium 1822, on which is stored one or more sets of data structures or instructions 1824 (e.g., software) embodying or utilized by any one or more of the techniques or functions described herein. In some aspects, registers of the processor 1802, the main memory 1804, the static memory 1806, and/or the mass storage 1816 may be, or include (completely or at least partially), the device-readable medium 1822, on which is stored the one or more sets of data structures or instructions 1824, embodying or utilized by any one or more of the techniques or functions described herein. In an example, one or any combination of the hardware processor 1802, the main memory 1804, the static memory 1806, or the mass storage 1816 may constitute the device-readable medium 1822.

As used herein, the term "device-readable medium" is interchangeable with "computer-readable medium" or "machine-readable medium". While the communication device-readable medium 1822 is illustrated as a single medium, the term "communication device-readable medium" may include a single medium or multiple media (e.g., a centralized or distributed database, and/or associated caches and servers) configured to store the one or more instructions 1824.

The term "communication device-readable medium" may include any medium that is capable of storing, encoding, or carrying instructions for execution by the communication device 1800 and that cause the communication device 1800 to perform any one or more of the techniques of the present disclosure, or that is capable of storing, encoding, or carrying data structures used by or associated with such instructions. Non-limiting communication device-readable medium examples may include solid-state memories, and optical and magnetic media. Specific examples of communication device-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM), and CD-ROM and DVD-ROM disks. In some examples, communication device-readable media may include non-transitory communication device-readable media. In some examples, communication device-readable media may include communication device-readable media that is not a transitory propagating signal.

The instructions 1824 may further be transmitted or received over a communications network 1826 using a transmission medium via the network interface device 1820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as Wi Max®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 1820 may include one or more physical jacks (e.g., Ethernet, coaxial, or phone jacks) or one or more antennas to connect to the communications network 1826. In an example, the network interface device 1820 may include a plurality of antennas to wirelessly communicate using at least one of single-input multiple-output (SIMO), MIMO, or multiple-input single-output (MISO) techniques. In some examples, the network interface device 1820 may wirelessly communicate using Multiple User MIMO techniques.

The term "transmission medium" shall be taken to include any intangible medium that is capable of storing, encoding, or carrying instructions for execution by the communication device 1800, and includes digital or analog communications signals or other intangible medium to facilitate communication of such software. In this regard, a transmission medium in the context of this disclosure is a device-readable medium.

FIG. 16 illustrates a system level diagram, depicting an example of an electronic device (e.g., system) that can include, for example, a transmitter configured to selectively fan out a signal to one of multiple communication channels. FIG. 16 is included to show an example of a higher-level device application for the subject matter discussed above with regards to FIGS. 1-15. In one aspect, system 1900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some aspects, system 1900 is a system on a chip (SOC) system.

In one aspect, processor 1910 has one or more processor cores 1912, . . . , 1912N, where 1912N represents the Nth processor core inside processor 1910 where N is a positive integer. In one aspect, system 1900 includes multiple processors including 1910 and 1905, where processor 1905 has logic similar or identical to the logic of processor 1910. In some aspects, processing core 1912 includes, but is not limited to, pre-fetch logic to fetch instructions, decode logic to decode the instructions, execution logic to execute instructions and the like. In some aspects, processor 1910 has a cache memory 1916 to cache instructions and/or data for system 1900. Cache memory 1916 may be organized into a hierarchal structure including one or more levels of cache memory.

In some aspects, processor 1910 includes a memory controller 1914, which is operable to perform functions that enable the processor 1910 to access and communicate with memory 1930 that includes a volatile memory 1932 and/or a non-volatile memory 1934. In some aspects, processor 1910 is coupled with memory 1930 and chipset 1920. Processor 1910 may also be coupled to a wireless antenna

1978 to communicate with any device configured to transmit and/or receive wireless signals. In one aspect, an interface for wireless antenna 1978 operates in accordance with, but is not limited to, the IEEE 802.11 standard and its related family, Home Plug AV (HPAV), Ultra Wide Band (UWB), Bluetooth, WiMax, or any form of wireless communication protocol.

In some aspects, volatile memory 1932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1934 includes, but is not limited to, flash memory, phase change memory (PCM), read-only memory (ROM), electrically erasable programmable read-only memory (EEPROM), or any other type of non-volatile memory device.

Memory 1930 stores information and instructions to be executed by processor 1910. In one aspect, memory 1930 may also store temporary variables or other intermediate information while processor 1910 is executing instructions. In the illustrated aspect, chipset 1920 connects with processor 1910 via Point-to-Point (PtP or P-P) interfaces 1917 and 1922. Chipset 1920 enables processor 1910 to connect to other elements in system 1900. In some aspects of the example system, interfaces 1917 and 1922 operate in accordance with a PtP communication protocol such as the Intel® QuickPath Interconnect (QPI) or the like. In other aspects, a different interconnect may be used.

In some aspects, chipset 1920 is operable to communicate with processor 1910, 1905N, display device 1940, and other devices, including a bus bridge 1972, a smart TV 1976, I/O devices 1974, nonvolatile memory 1960, a storage medium (such as one or more mass storage devices) 1962, a keyboard/mouse 1964, a network interface 1966, and various forms of consumer electronics 1977 (such as a PDA, smart phone, tablet etc.), etc. In one aspect, chipset 1920 couples with these devices through an interface 1924. Chipset 1920 may also be coupled to a wireless antenna 1978 to communicate with any device configured to transmit and/or receive wireless signals.

Chipset 1920 connects to display device 1940 via interface 1926. Display 1940 may be, for example, a liquid crystal display (LCD), a plasma display, cathode ray tube (CRT) display, or any other form of visual display device. In some aspects of the example system, processor 1910 and chipset 1920 are merged into a single SOC. In addition, chipset 1920 connects to one or more buses 1950 and 1955 that interconnect various system elements, such as I/O devices 1974, nonvolatile memory 1960, storage medium 1962, a keyboard/mouse 1964, and network interface 1966. Buses 1950 and 1955 may be interconnected together via a bus bridge 1972.

In one aspect, mass storage device 1962 includes, but is not limited to, a solid-state drive, a hard disk drive, a universal serial bus flash memory drive, or any other form of computer data storage medium. In one aspect, network interface 1966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one aspect, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 16 are depicted as separate blocks within the system 1900, the functions performed by some of these blocks may be integrated within a single semiconductor circuit or may be implemented using two or more separate integrated circuits. For example, although cache memory 1916 is depicted as a separate block within processor 1910, cache memory 1916 (or selected aspects of 1916) can be incorporated into processor core 1912.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one aspect", "an aspect", "an example aspect", "some aspects", "demonstrative aspect", "various aspects" etc., indicate that the aspect(s) so described may include a particular feature, structure, or characteristic, but not every aspect necessarily includes the particular feature, structure, or characteristic. Further, repeated use of the phrase "in one aspect" does not necessarily refer to the same aspect, although it may.

As used herein, unless otherwise specified the use of the ordinal adjectives "first", "second", "third" etc., to describe a common object, merely indicate that different instances of like objects are being referred to and are not intended to imply that the objects so described must be in a given sequence, either temporally, spatially, in ranking, or in any other manner.

Some aspects may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a sensor device, an Internet of Things (IoT) device, a wearable device, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some aspects may, for example, be used in conjunction with devices and/or networks operating in accordance with existing IEEE 802.11 standards (including IEEE 802.11-2016 (IEEE 802.11-2016, IEEE Standard for Information technology—Telecommunications and information exchange between systems Local and metropolitan area networks-Specific requirements Part 11: Wireless LAN Medium Access Control (MAC) and Physical Layer (PHY)

Specifications, Dec. 7, 2016); IEEE 802.1 lay (P802.11ay Standard for Information Technology—Telecommunications and Information Exchange Between Systems Local and Metropolitan Area Networks-Specific Requirements Part 11: Wireless LAN Medium Access Control (MAC) and Physical Layer (PHY) Specifications—Amendment: Enhanced Throughput for Operation in License-Exempt Bands Above 45 GHz)) and/or future versions and/or derivatives thereof, devices and/or networks operating in accordance with existing WiFi Alliance (WFA) Peer-to-Peer (P2P) specifications (including WiFi P2P technical specification, version 1.5, Aug. 4, 2015) and/or future versions and/or derivatives thereof, devices and/or networks operating in accordance with existing Wireless-Gigabit-Alliance (WGA) specifications (including Wireless Gigabit Alliance, Inc WiGig MAC and PHY Specification Version 1.1, April 2011, Final specification) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some aspects may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some aspects may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), FDM Time-Division Multiplexing (TDM), Time-Division Multiple Access (TDMA), Multi-User MIMO (MU-MIMO), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other aspects may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative aspects, a wireless device may be or may include a peripheral that is integrated with a computer, or a peripheral that is attached to a computer. In some demonstrative aspects, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting and/or the action of receiving. In one example, the phrase "communicating a signal" may refer to the action of transmitting the signal by a first device and may not necessarily include the action of receiving the signal by a second device. In another example, the phrase "communicating a signal" may refer to the action of receiving the signal by a first device and may not necessarily include the action of transmitting the signal by a second device.

Some demonstrative aspects may be used in conjunction with a wireless communication network communicating over a frequency band above 45 Gigahertz (GHz), e.g., 60 GHz. However, other aspects may be implemented utilizing any other suitable wireless communication frequency bands, for example, an Extremely High Frequency (EHF) band (the millimeter wave (mmWave) frequency band), e.g., a frequency band within the frequency band of between 20 GHz and 300 GHz, a frequency band above 45 GHz, a frequency band below 20 GHz, e.g., a Sub 1 GHz (SIG) band, a 2.4 GHz band, a 5 GHz band, a WLAN frequency band, a WPAN frequency band, a frequency band according to the WGA specification, and the like.

As used herein, the term "circuitry" may, for example, refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some aspects, circuitry may include logic, at least partially operable in hardware. In some aspects, the circuitry may be implemented as part of and/or in the form of a radio virtual machine (RVM), for example, as part of a Radio processor (RP) configured to execute code to configured one or more operations and/or functionalities of one or more radio components.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The term "antenna" or "antenna array", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

Additional Notes and Aspects

Example 1 is an oscillator circuit, comprising: an oscillator; measurement circuitry coupled to the oscillator, the measurement circuitry configured to receive an output signal of the oscillator and to measure oscillator error by comparing the output signal of the oscillator to a nominal frequency for an amount of time; and adjustment circuitry to adjust an oscillator frequency of the oscillator based on the measured oscillator error.

In Example 2, the subject matter of Example 1 can optionally include an interface to receive a serial protocol command.

In Example 3, the subject matter of Example 2 can optionally include wherein the amount of time is based on a number of clock cycles of the serial protocol command.

In Example 4, the subject matter of Example 2 can optionally include wherein the measurement circuitry comprises a phase detector, and wherein the phase detector is configured to compare the output signal of the oscillator to a clock signal provided over a serial interface.

In Example 5, the subject matter of Example 4 can optionally include wherein adjustment and measurement are performed periodically and in an oscillator calibration phase.

In Example 6, the subject matter of Example 2 can optionally include wherein the oscillator is configured to remain enabled for a duration subsequent to a last clock cycle of the serial protocol command, and to terminate operation after the duration.

In Example 7, the subject matter of Example 2 can optionally include wherein the measurement circuitry comprises a period measurement circuit, and the period measurement circuit is configured to detect a number of clock transitions of the oscillator or derived frequencies, the number of clock transitions to be measured being based on a clock signal provided over a serial interface.

In Example 8, the subject matter of any one of Examples 1-7 can optionally include wherein the adjustment circuitry comprises a low dropout regulator (LDO).

In Example 9, the subject matter of any one of Examples 1-8 can optionally include divider circuitry to divide the output signal of the oscillator, and the adjustment circuitry is configured to adjust an output of the divider circuitry and to refrain from adjusting the oscillator frequency.

In Example 10, the subject matter of any one of Examples 1-9 can optionally include wherein the adjustment circuitry is configured to adjust an event trigger value and to refrain from adjusting the oscillator frequency.

In Example 11, the subject matter of any one of Examples 1-10 can optionally include wherein the oscillator comprises a ring oscillator and the oscillator frequency is in a range of less than 20 gigahertz (GHz).

Example 12 is a wireless communication device comprising a communications interface configured to provide a reference control command having a number of clock cycles; and radio frequency (RF) circuitry coupled to the communications interface, the RF circuitry comprising an oscillator; measurement circuitry coupled to the oscillator, the measurement circuitry configured to receive an output signal of the oscillator and to measure oscillator error by comparing the output signal of the oscillator relative to a nominal frequency for an amount of time; and adjustment circuitry to adjust one of an oscillator frequency of the oscillator based on the measured oscillator error.

In Example 13, the subject matter of Example 12 can optionally include wherein the communications interface comprises a serial communication interface.

In Example 14, the subject matter of Example 13 can optionally include wherein the reference control command comprises a serial protocol command, and wherein the amount of time is based on a number of clock cycles of the serial protocol command.

In Example 15, the subject matter of Example 13 can optionally include wherein the measurement circuitry comprises a phase detector, and wherein the phase detector is configured to compare the output signal of the oscillator to a clock signal provided over the serial communication interface.

In Example 16, the subject matter of any one of Examples 12-15 can optionally include wherein the oscillator is configured to remain enabled for a duration subsequent to a last clock cycle of the reference control command, and to terminate operation after the duration.

Example 17 is a method for operating an oscillator in a wireless communication device, the method comprising: receiving an output signal of the oscillator; measuring oscillator error by comparing the output signal of the oscillator to a nominal frequency for an amount of time; and adjusting an oscillator frequency of the oscillator based on the measured oscillator error.

In Example 18, the subject matter of Example 17 can optionally include receiving at least one of a reference control command and a clock signal over a serial communications interface.

In Example 19, the subject matter of Example 18 can optionally include determining the amount of time over which to measure oscillator error based on a number of clock cycles of the reference control command.

In Example 20, the subject matter of Example 18 can optionally include operating one of an analog to digital converter (ADC) and fuse circuitry based on the output signal of the oscillator.

In Example 21, the subject matter of Example 20 can optionally include terminating operation of the oscillator after a time period subsequent to the reference control command.

In Example 22, the subject matter of any of Examples 17-21 can optionally include performing the adjusting and measuring upon startup of the wireless communication device and periodically after startup.

The above detailed description includes references to the accompanying drawings, which form a part of the detailed description. The drawings show, by way of illustration, specific aspects in which the invention can be practiced. These aspects are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other aspects can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description, with each claim standing on its own as a separate aspect, and it is contemplated that such aspects can be combined with each other in various combinations or permutations. The scope of the invention should be determined with reference to the appended claims, along with the full scope of equivalents to which such claims are legally entitled.

What is claimed is:

1. An oscillator circuit comprising:
an oscillator;
measurement circuitry coupled to the oscillator, the measurement circuitry configured to receive an output signal of the oscillator and to measure oscillator error by comparing the output signal of the oscillator to a nominal frequency for an amount of time, the amount of time based on a serial protocol command received by the oscillator circuit; and
adjustment circuitry to adjust an oscillator frequency of the oscillator based on the measured oscillator error.

2. The oscillator circuit of claim 1, further comprising an interface to receive the serial protocol command.

3. The oscillator circuit of claim 2, wherein the amount of time is based on a number of clock cycles of the serial protocol command.

4. The oscillator circuit of claim 2, wherein the measurement circuitry comprises a phase detector, and wherein the phase detector is configured to compare the output signal of the oscillator to a clock signal provided over a serial interface.

5. The oscillator circuit of claim 4, wherein adjustment and measurement are performed periodically and in an oscillator calibration phase.

6. The oscillator circuit of claim 2, wherein the oscillator is configured to remain enabled for a duration subsequent to a last clock cycle of the serial protocol command, and to terminate operation after the duration.

7. The oscillator circuit of claim 2, wherein the measurement circuitry comprises a period measurement circuit, and the period measurement circuit is configured to detect a number of clock transitions of the oscillator or derived frequencies, the number of clock transitions to be measured being based on a clock signal provided over a serial interface.

8. The oscillator circuit of claim 1, wherein the adjustment circuitry comprises a low dropout regulator (LDO).

9. The oscillator circuit of claim 1, further comprising divider circuitry to divide the output signal of the oscillator, and the adjustment circuitry is configured to adjust an output of the divider circuitry and to refrain from adjusting the oscillator frequency.

10. The oscillator circuit of claim 1, wherein the adjustment circuitry is configured to adjust an event trigger value and to refrain from adjusting the oscillator frequency.

11. The oscillator circuit of claim 1, wherein the oscillator comprises a ring oscillator and the oscillator frequency is in a range of less than 20 gigahertz (GHz).

12. A wireless communication device, comprising:
a communications interface configured to provide a reference control command having a number of clock cycles; and
radio frequency (RF) circuitry coupled to the communications interface, the RF circuitry comprising:
an oscillator;
measurement circuitry coupled to the oscillator, the measurement circuitry configured to receive an output signal of the oscillator and to measure oscillator error by comparing the output signal of the oscillator relative to a nominal frequency for an amount of time, the amount of time based on a serial protocol command received by the wireless communication device; and
adjustment circuitry to adjust one of an oscillator frequency of the oscillator based on the measured oscillator error.

13. The wireless communication device of claim 12, wherein the communications interface comprises a serial communication interface.

14. The wireless communication device of claim 13, wherein the reference control command comprises the serial protocol command, and wherein the amount of time is based on a number of clock cycles of the serial protocol command.

15. The wireless communication device of claim 13, wherein the measurement circuitry comprises a phase detector, and wherein the phase detector is configured to compare the output signal of the oscillator to a clock signal provided over the serial communication interface.

16. The wireless communication device of claim 12, wherein the oscillator is configured to remain enabled for a duration subsequent to a last clock cycle of the reference control command, and to terminate operation after the duration.

17. A method for operating an oscillator in a wireless communication device, the method comprising:

receiving an output signal of the oscillator;
measuring oscillator error by comparing the output signal of the oscillator to a nominal frequency for an amount of time, the amount of time based on a reference control command received by the wireless communication device; and
adjusting an oscillator frequency of the oscillator based on the measured oscillator error.

18. The method of claim 17, further comprising:
receiving at least one of the reference control command and a clock signal over a serial communications interface.

19. The method of claim 18, further comprising:
determining the amount of time over which to measure oscillator error based on a number of clock cycles of the reference control command.

20. The method of claim 18, further comprising:
operating one of an analog-to-digital converter (ADC) and fuse circuitry based on the output signal of the oscillator.

21. The method of claim 20, further comprising:
terminating operation of the oscillator after a time period subsequent to the reference control command.

22. The method of claim 17, further comprising:
performing the adjusting and measuring upon startup of the wireless communication device and periodically after startup.

* * * * *